United States Patent
Taigor et al.

(10) Patent No.: US 9,704,591 B2
(45) Date of Patent: *Jul. 11, 2017

(54) TEMPERATURE INDEPENDENT REFERENCE CURRENT GENERATION FOR CALIBRATION

(71) Applicant: SanDisk Technologies Inc., Plano, TX (US)

(72) Inventors: Subodh Prakash Taigor, Bangalore (IN); Sridhar Yadala, Bangalore (IN); Rangarao Samineni, Bangalore (IN)

(73) Assignee: SanDisk Technologies LLC, Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/082,241

(22) Filed: Mar. 28, 2016

(65) Prior Publication Data

US 2016/0211031 A1 Jul. 21, 2016

Related U.S. Application Data

(63) Continuation-in-part of application No. 14/928,466, filed on Oct. 30, 2015.
(Continued)

(51) Int. Cl.
*G05F 3/16* (2006.01)
*G11C 16/28* (2006.01)
(Continued)

(52) U.S. Cl.
CPC ............. *G11C 16/28* (2013.01); *G05F 1/463* (2013.01); *G05F 3/16* (2013.01); *G11C 5/147* (2013.01);
(Continued)

(58) Field of Classification Search
CPC ......... H03K 19/005; H03K 19/017545; H03K 19/017581; H03K 19/01759;
(Continued)

(56) References Cited

U.S. PATENT DOCUMENTS 5,231,316 A * 7/1993 Thelen, Jr. .............. H03F 1/301
327/103
6,459,326 B2 * 10/2002 Descombes ............. G05F 3/245
327/362
(Continued)

OTHER PUBLICATIONS

U.S. Appl. No. 14/928,466, filed Oct. 30, 2015.
Non-final Office Action dated Oct. 27, 2016, U.S. Appl. No. 14/928,466, filed Oct. 30, 2015.

*Primary Examiner* — Thomas J Hiltunen
(74) *Attorney, Agent, or Firm* — Vierra Magen Marcus LLP

(57) ABSTRACT

Disclosed herein are techniques for generating a temperature independent reference current, which may be used during calibration. The temperature independent reference current may be generated based on a current through an on-chip calibration resistor. This alleviates the need for an off chip calibration resistor, which can be costly and cause slow calibration. A voltage at one terminal of the on chip calibration resistor may be modulated to substantially cancel a temperature coefficient of the on chip calibration resistor. This may result in the current passing through the on chip calibration resistor being temperature independent. The temperature independent reference current may be based on a reference voltage and a target calibration resistance.

22 Claims, 11 Drawing Sheets

Related U.S. Application Data

(60) Provisional application No. 62/093,307, filed on Dec. 17, 2014.

(51) Int. Cl.
- *G05F 1/46* (2006.01)
- *G11C 16/06* (2006.01)
- *H03K 19/00* (2006.01)
- *G11C 5/14* (2006.01)
- *G11C 7/04* (2006.01)

(52) U.S. Cl.
CPC .............. *G11C 7/04* (2013.01); *G11C 16/06* (2013.01); *H03K 19/0005* (2013.01); *G11C 2207/2254* (2013.01)

(58) Field of Classification Search
CPC ... H03K 19/018557; H03K 19/018585; H03K 19/018592; H03K 19/018564; H03K 19/018571; H03K 19/018578
See application file for complete search history.

(56) References Cited

U.S. PATENT DOCUMENTS

| | | | |
|---|---|---|---|
| 6,836,170 B2 * | 12/2004 | Kitagawa | H03H 11/28 307/99 |
| 7,064,575 B2 * | 6/2006 | Lou | H04L 25/0278 326/27 |
| 7,170,318 B2 * | 1/2007 | Kim | H03K 19/00384 326/26 |
| 7,504,878 B2 * | 3/2009 | Lin | G05F 1/567 323/313 |
| 7,773,400 B2 | 8/2010 | Nakamori et al. | |
| 7,821,292 B2 | 10/2010 | Yang et al. | |
| 7,839,159 B2 | 11/2010 | Nakamura et al. | |
| 7,869,973 B2 | 1/2011 | Yoko et al. | |
| 7,965,100 B1 * | 6/2011 | Considine | H03K 19/00384 326/30 |
| 7,969,182 B2 | 6/2011 | Kim et al. | |
| 7,990,174 B2 | 8/2011 | Park | |
| 8,064,250 B2 | 11/2011 | Abdulla | |
| 8,111,084 B2 | 2/2012 | Kim | |
| 8,159,261 B2 | 4/2012 | Kim et al. | |
| 8,238,180 B2 | 8/2012 | Jung | |
| 8,289,767 B2 | 10/2012 | Abdulla | |
| 8,344,776 B2 | 1/2013 | Baba | |
| 8,364,434 B2 | 1/2013 | Yoko et al. | |
| 8,446,209 B1 * | 5/2013 | Horsky | H03B 5/08 327/513 |
| 8,489,044 B2 * | 7/2013 | Oliaei | H04B 1/0475 455/114.3 |
| 8,509,008 B2 * | 8/2013 | Lee | G11C 7/04 365/189.07 |
| 8,582,356 B2 | 11/2013 | Abdulla | |
| 8,710,904 B2 * | 4/2014 | Polley | H03H 11/02 327/378 |
| 8,811,055 B2 * | 8/2014 | Yoon | G11C 7/1084 365/189.05 |
| 8,907,652 B2 * | 12/2014 | Lecce | G05F 3/30 323/313 |
| 9,019,727 B2 * | 4/2015 | Chen | H02M 3/156 363/21.12 |
| 9,391,523 B2 * | 7/2016 | Gaknoki | H02M 3/33507 |
| 2004/0124850 A1 * | 7/2004 | Koneru | G01R 35/005 324/601 |
| 2007/0132493 A1 | 6/2007 | Fujisawa et al. | |
| 2007/0148796 A1 | 6/2007 | Nakamura et al. | |
| 2009/0302825 A1 * | 12/2009 | Hsieh | G05F 3/24 323/315 |
| 2011/0066798 A1 | 3/2011 | Kaiwa et al. | |

* cited by examiner

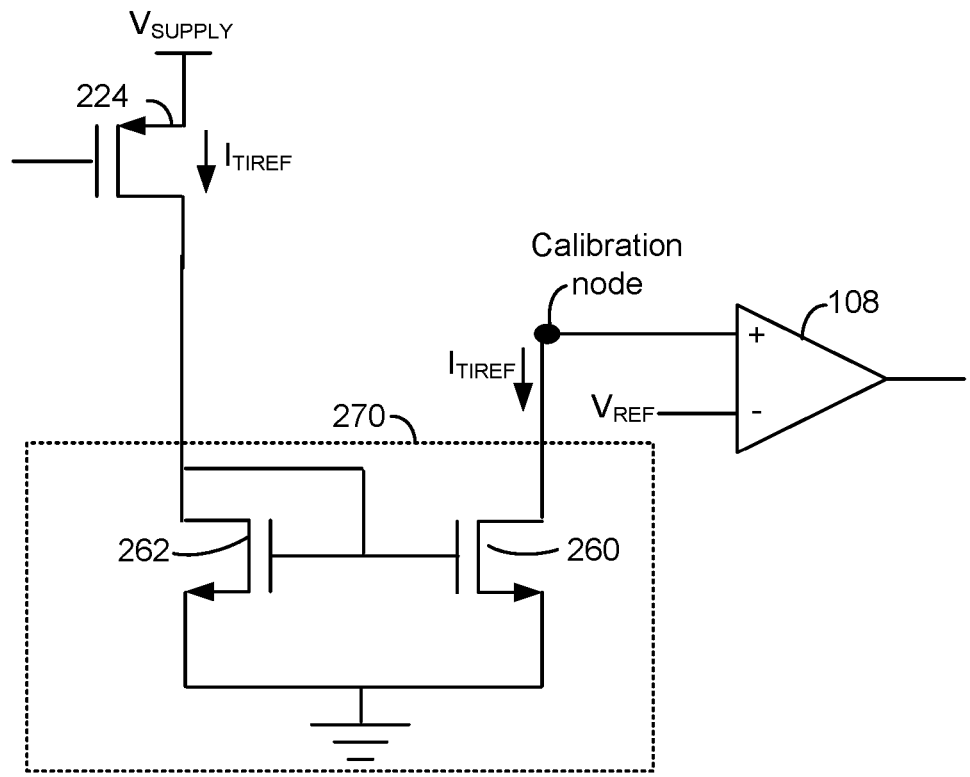
FIG. 2C1
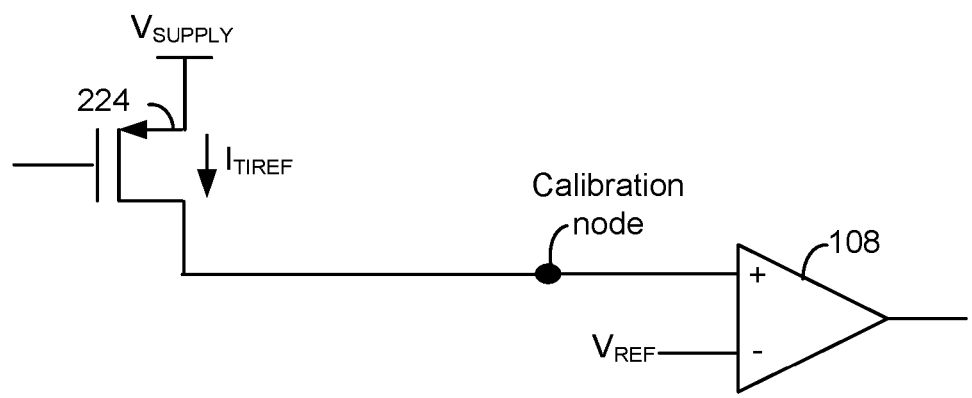
FIG. 2C2

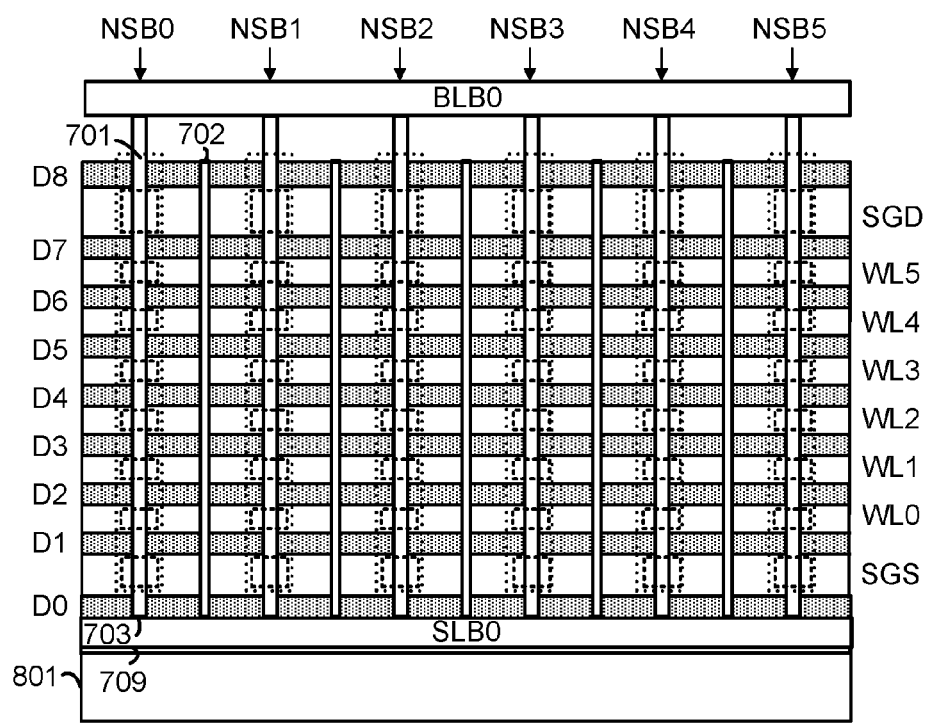

TEMPERATURE INDEPENDENT REFERENCE CURRENT GENERATION FOR CALIBRATION

CLAIM OF PRIORITY

The present application is a continuation-in-part and claims priority from U.S. patent application Ser. No. 14/928,466 entitled "Temperature Independent Reference Current Generation for Calibration," filed on Oct. 30, 2015, which claims priority to U.S. Provisional Patent Application No. 62/093,307 entitled "ON CHIP ZQ CALIBRATION," filed Dec. 17, 2014; both said applications are incorporated herein by reference in their entirety.

BACKGROUND

The present technology relates to semiconductors and/or non-volatile memory devices.

Most semiconductor devices include an input circuit configured to receive signals from the outside world via input pads (or pins) and an output circuit configured to provide internal signals to the outside via output pads (or pins). The input circuit has a termination resistor for impedance matching of the external transmission line. The output circuit has an output driver, which has a resistance ($R_{ON}$). The impedance of both the termination resistor and the output driver can change due to various circumstances such as variation of a power supply voltage, a change in operating temperature, etc. Thus, an impedance mismatch can arise.

The impedance mismatch can cause signal reflection, which can compromise signal integrity. As the operating speed of electrical products has increased, the swing width (that is the difference between high and low logic levels) of a signal interfaced between semiconductor devices gradually has been reduced in order to minimize a delay time taken for signal transmission. However, the reduction in the swing width of the signal easily exposes the signal to external noise, causing signal reflection to become more critical at an interface terminal due to impedance mismatch. Thus, the impedance mismatch may lead to a difficulty in high-speed transmission of data and distortion of output data.

To alleviate impedance mismatch, the device's output drivers and the device's termination resistors may be periodically calibrated. One calibration technique is referred to as a ZQ calibration. Conventionally, ZQ calibration may use a precision calibration resistor that is located off chip. The chip may have a variable impedance circuit which is calibrated with respect to the off chip resistor. The ZQ calibration adjusts the impedance of the variable impedance circuit until it is calibrated to the off chip resistor. This results in an impedance code that can be used to adjust the impedance of the device's output drivers.

BRIEF DESCRIPTION OF THE DRAWINGS

Like-numbered elements refer to common components in the different figures.

FIG. 2C1 is a diagram of one embodiment of a circuit for providing the temperature independent reference current of FIG. 2A to a calibration node when using the circuit of FIG. 1A.

FIG. 2C2 depicts one embodiment of a circuit that provides $I_{TIREF}$ to the calibration node when using the circuit of FIG. 1B.

FIG. 7 depicts a cross-sectional view of a block of the 3D non-volatile memory device of having straight strings.

DETAILED DESCRIPTION

Figure 1A:
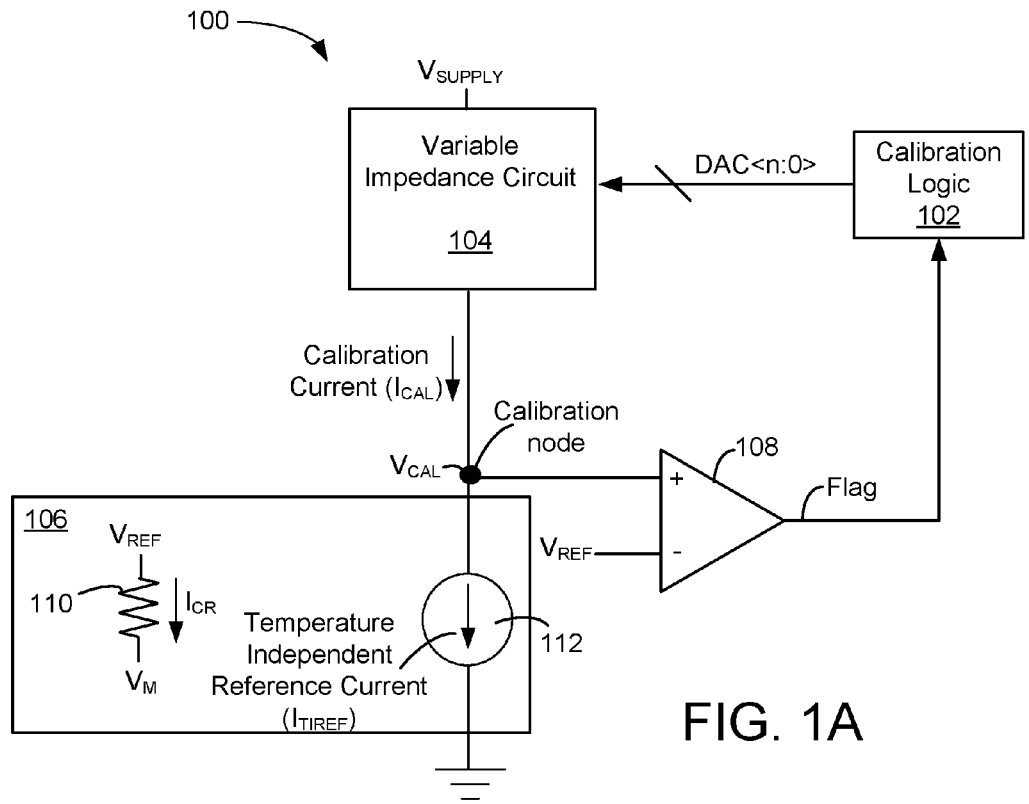
FIG. 1A is a diagram of one embodiment of a calibration circuit having a temperature independent reference current generation.

Disclosed herein are techniques and apparatus for generating a temperature independent reference current, which may be used during calibration. The temperature independent reference current may be generated based on a current through an on-chip calibration resistor. In one embodiment, the temperature independent reference current is used in a ZQ calibration circuit. In one embodiment, the temperature independent reference current is based on a reference voltage and a target calibration resistance. For example, the temperature independent reference current may be equal to reference voltage divided by the target calibration resistance. In one embodiment, the reference voltage is compared with a calibration voltage in a ZQ calibration circuit. Depending on results of this comparison, a variable impedance may be adjusted to bring the variable impedance closer to, or equal to, the target calibration resistance.

In one embodiment, the device has an on chip calibration resistor. This alleviates the need for an off chip calibration resistor. Off chip calibration resistors can be costly. A part of the cost may be in providing an extra pin or pad for the off chip calibration resistor to connect to. Also, ZQ calibration using an off chip calibration resistor can be slow. A reason for this is capacitive loading on the pad or pin to which the off chip calibration resistor is connected. Embodiments disclosed herein provide for fast calibration (e.g., fast ZQ calibration). Embodiments disclosed herein provide for cost effective calibration (e.g., cost effective ZQ calibration).

The resistance of the on chip calibration resistor may depend on temperature. For example, its resistance may either decrease or increase as temperature increases. The temperature dependence may be expressed by a temperature coefficient (TCO) having a sign and magnitude. By a positive temperature coefficient in this context it is meant that the resistance increases as temperature increases and decreases as temperature decreases, for at least a range of temperatures at which the device is normally operated. By a negative temperature coefficient in this context it is meant that the resistance decreases as temperature increases and increases as temperature decreases, for at least a range of temperatures at which the device is normally operated.

Note that if a resistor is operated with a constant voltage applied across its two terminals, then the current through the resistor may be a function of temperature. For example, if the resistance drops as temperature increases, then the current will increase as temperature increases—given the constant voltage difference assumption.

Note that the temperature of the device for which the calibration is being performed may vary widely. Thus, the resistance of the on chip calibration resistor may change over time, in response to the temperature changing. In some embodiments, a temperature independent reference current is generated based on a current that passes through the on chip calibration resistor. Herein, a temperature independent reference current refers to a reference current whose magnitude does not change as temperature changes.

A voltage at one terminal of the on chip calibration resistor is modulated to substantially cancel the temperature coefficient of the on chip calibration resistor, in one embodiment. This may result in the current passing through the on chip calibration resistor being temperature independent. For example, given that a certain reference voltage is applied to one terminal of the on chip calibration resistor, the voltage applied to the other terminal may be modulated as temperature changes, such that the current passing through the on chip calibration resistor is constant regardless of the temperature.

FIG. 1A is a diagram of one embodiment of a circuit 100 that performs a calibration using a temperature independent reference current. In one embodiment, the circuit 100 adjusts the impedance of variable impedance circuit 104 until its impedance matches a target resistance ($R_T$). The circuit could be used in a ZQ calibration process to determine, for example, calibration codes. However, instead of using an off-chip resistor for the target resistance, the circuit makes use of an on-chip resistor 110 to perform the calibration. In one embodiment, circuit 100 resides on an integrated circuit.

Temperature independent reference current generation circuit 106 generates a temperature independent reference current ($I_{TIREF}$) 112 based on a current ($I_{CR}$) through on-chip calibration resistor 110. Temperature independent reference current generation circuit 106 maintains the temperature independent reference current ($I_{TIREF}$) at a constant magnitude despite temperature variations. Those of ordinary skill in the art will understand that maintaining at a constant magnitude may include some small variation in the magnitude of the temperature independent reference current ($I_{TIREF}$) with respect to temperature due to non-ideal characteristics of real world circuit elements.

The resistance of on-chip calibration resistor 110 has a temperature coefficient (TCO) due to, for example, the material from which it is fabricated. In one embodiment, the TCO is a positive TCO. That is, the resistance of on-chip calibration resistor 110 increases as temperature increases and decreases as temperature decreases. In one embodiment, the TCO is a negative TCO. That is, the resistance of on-chip calibration resistor 110 decreases as temperature increases and increases as temperature decreases. In one embodiment, the resistor 110 is formed from polysilicon. However, a different semiconductor could be used. In one embodiment, the resistor 110 is formed from a doped semiconductor, such as doped silicon. Also, the resistor 110 may be formed from a material that is not a semiconductor. In one embodiment, resistor 110 resides within an integrated circuit.

In the circuit 100 of FIG. 1A, the on-chip calibration resistor 110 has a reference voltage $V_{REF}$ applied to one terminal. The other terminal is supplied with a modulating voltage $V_M$. The modulating voltage cancels the TCO of the resistor 110, in one embodiment. Those of ordinary skill in the art will understand that canceling the TCO of the resistor 110 may include some small temperature dependence of the resistance of resistor 110 due to non-ideal characteristics of real world circuit elements, including those circuit elements that provide the modulating voltage.

By cancelling the TCO of the resistor 110, the current ($I_{CR}$) through the resistor is independent of temperature, in one embodiment. Thus, the current ($I_{CR}$) may be maintained at a constant magnitude despite temperature variations. Those of ordinary skill in the art will understand that maintaining the current ($I_{CR}$) at a constant magnitude despite temperature variations may include some small variation in the magnitude of the current ($I_{CR}$) with respect to temperature due to non-ideal characteristics of real world circuit elements.

By the modulating voltage having a TCO, it is meant that the magnitude of the modulating voltage is a function of temperature. Thus, a positive TCO for the modulating voltage means that its magnitude increases as temperature increases and decreases as temperature decreases. A negative TCO for the modulating voltage means that its magnitude decreases as temperature increases, and increases as temperature decreases.

The modulating voltage substantially cancels the TCO of the resistor 110, in one embodiment. By substantially cancelling the TCO of the resistor 110, the current ($I_{CR}$) through the resistor is substantially independent of temperature, in one embodiment.

Variable impedance circuit 104 outputs a calibration current ($I_{CAL}$). In one embodiment, $I_{CAL}$ is ($V_{SUPPLY}$/2)/$R_T$, where $R_T$ is a target calibration resistance. The calibration logic 102 outputs an impedance code (DAC<n:0>) to the variable impedance circuit 104. In this example, the impedance code has n+1 bits. The variable impedance circuit 104 adjusts its impedance based on the impedance code. In one embodiment, the voltage at the calibration node is $V_{SUPPLY}$−($I_{TIREF}$*$R_{VIC}$), where $I_{TIREF}$ is the Temperature Independent Reference Current and $R_{VIC}$ is the impedance of the Variable Impedance Circuit 104 at a given DAC. The voltage at the calibration node may be referred to as $V_{CAL}$. Note that the magnitude of the calibration current ($I_{CAL}$) may be equal to $I_{TIREF}$. In one embodiment, $I_{CAL}$ is equal to ($V_{SUPPLY}$−$V_{CAL}$)/$R_{VIC}$. Calibration logic 102 may be implemented in a variety of ways, including but not limited to, a state machine, a processor, digital logical, or a combination of any of these elements. The processor may execute instructions that are stored on computer readable storage.

The variable impedance circuit 104 may comprise a number of circuit elements, such as transistors. The variable impedance circuit 104 turns those transistors on or off in response to the value of the impedance code (DAC) to alter the impedance of the variable impedance circuit 104, in one embodiment. In one embodiment, variable impedance circuit 104 is a binary weighted transistor circuit. In one embodiment, the variable impedance circuit 104 is configured to have $2^{n+1}$ different impedances in response to the different values of an "n+1" bit impedance code (DAC).

Figure 4A:
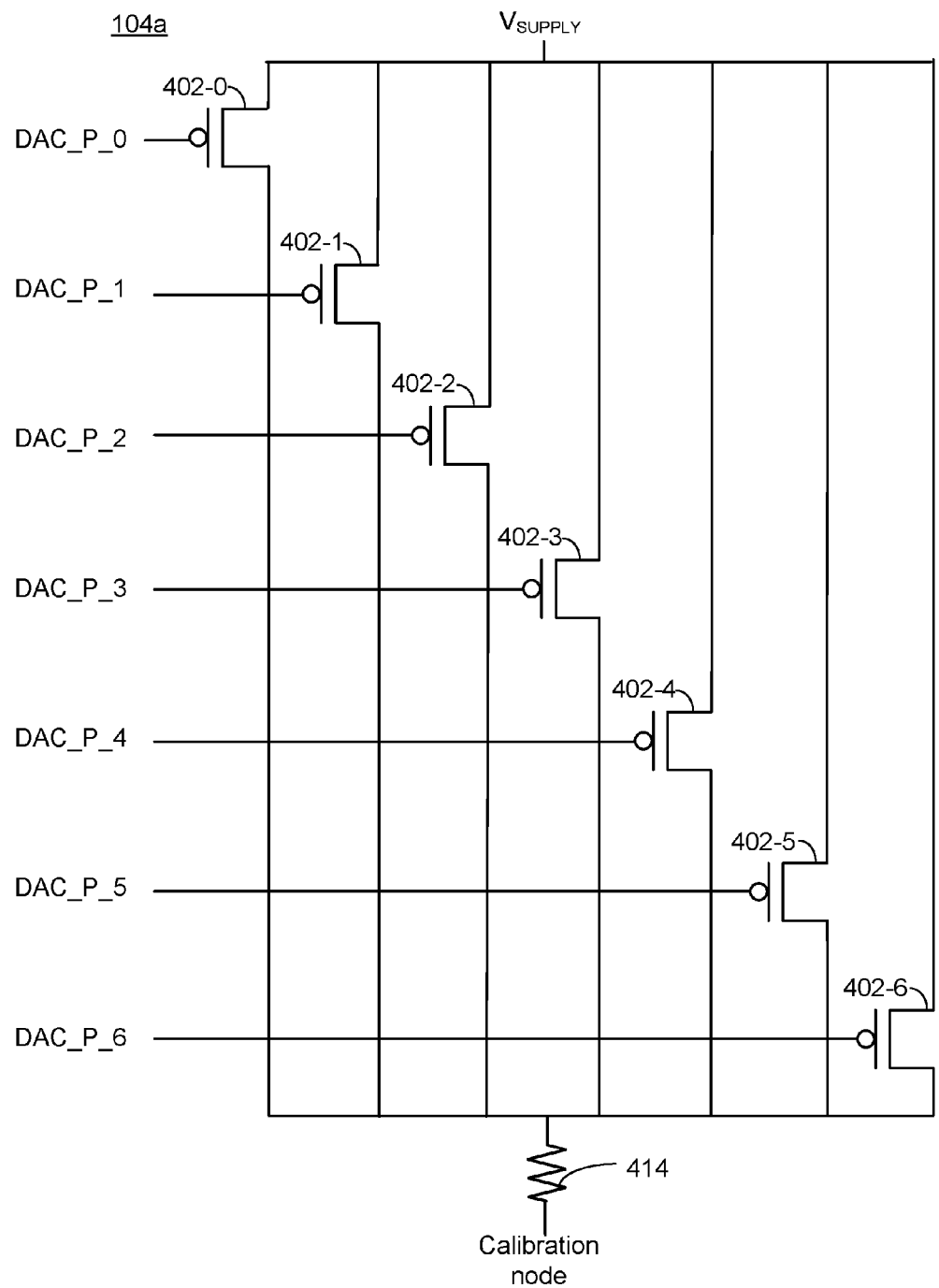
FIG. 4A depicts one embodiment of the variable impedance circuit 104 of FIG. 1A.

FIG. 4A provides further details of one embodiment of the variable impedance circuit 104 of FIG. 1A.

The inverting input of the comparator 108 is supplied with a reference voltage $V_{REF}$. In one embodiment, $V_{REF}$ is half the magnitude of $V_{SUPPLY}$. Thus, in one embodiment, $I_{CAL}$ is equal to $(2V_{REF}-V_{CAL})/R_{VIC}$. Comparator 108 compares the magnitude of the voltage at the non-inverting input (e.g., $V_{CAL}$) with $V_{REF}$ (supplied to the inverting input). In one embodiment, the magnitude of $I_{TIREF}$ is based on the reference voltage ($V_{REF}$) and the target resistance ($R_T$) to which the variable impedance circuit 104 is being calibrated. In one embodiment, the following equation holds:

$$I_{TIREF} = V_{REF}/R_T \quad (1)$$

In one embodiment, the following equation holds in addition to Equation 1:

$$V_{REF} = V_{SUPPLY}/2 \quad (2)$$

Recall that the target resistance ($R_T$) may be the resistance to which the variable impedance circuit 104 is being calibrated. The resistance of the on-chip calibration resistor 110 may be related to the target resistance ($R_T$). However, the resistance of the on-chip calibration resistor 110 does not necessarily equal the target resistance ($R_T$). For example, both currents and resistances can be scaled on chip. For example, the resistance of the on-chip calibration resistor 110 could be scaled up from the target resistance to permit on chip currents to be scaled down.

Comparator 108 outputs a signal ("Flag") to the calibration logic 102 that indicates whether the magnitude of the voltage at the non-inverting input is greater than or less than the magnitude of the voltage at the inverting input. The calibration logic 102 adjusts the impedance code (DAC) based on the value of the Flag. In one embodiment, if the Flag indicates that the voltage at the calibration node is too high (relative to $V_{REF}$), then the new impedance code will cause the variable impedance circuit 104 to increase its impedance. On the other hand, if the flag indicates that the magnitude of the voltage at the calibration node is too low (relative to $V_{REF}$), then the new impedance code (DAC) will cause the variable impedance circuit 104 to decrease its impedance. In one embodiment, a binary search is performed to seek a new impedance code. In one embodiment, a linear search is performed to find a new impedance code. In one embodiment, Flag is "1" as long as $V_{CAL}$ is higher than $V_{REF}$. In one embodiment, when $V_{CAL}$ is slightly less than $V_{REF}$, Flag becomes "0", and trimming is complete. At the completion of trimming, the impedance of the PMOS drivers (e.g., 402 in FIG. 4A) in the variable impedance circuit 104 are equal to or slightly greater than $R_T$, in one embodiment.

Figure 1B:
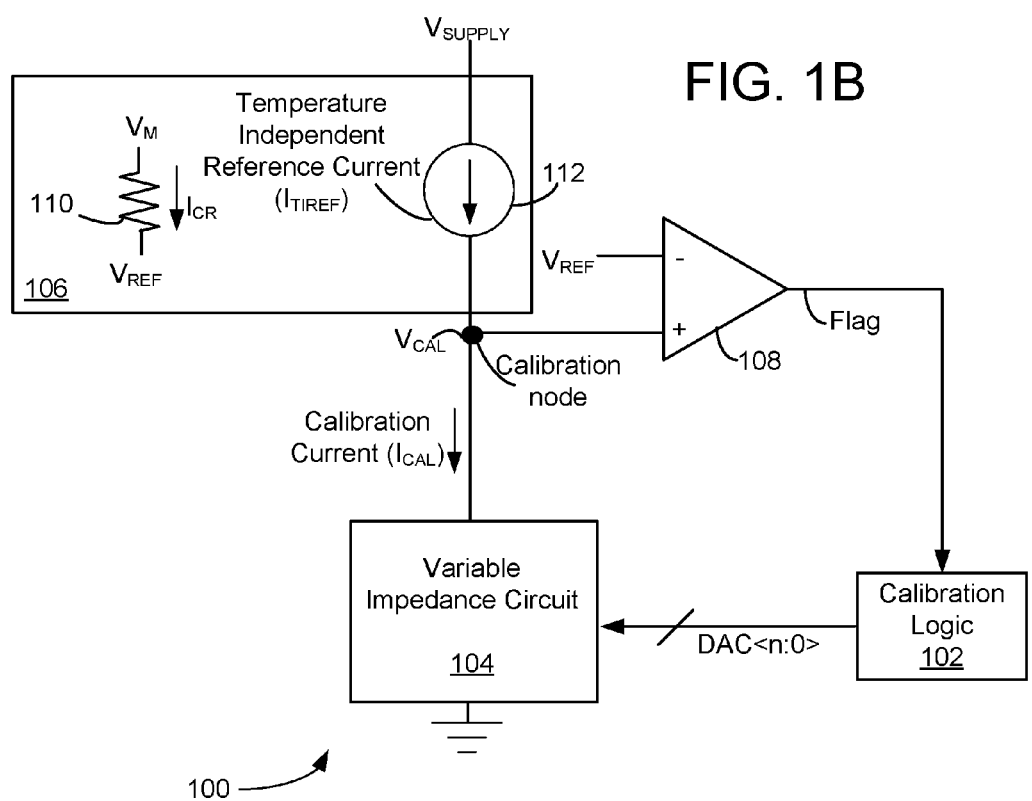
FIG. 1B is a diagram of another embodiment of a calibration circuit having a temperature independent reference current generation.

As noted above, the circuit of FIG. 1A may be used with the PMOS drivers of FIG. 4A. FIG. 1B depicts one embodiment of a circuit that is similar to the circuit of FIG. 1A, but may be used with NMOS drivers, such as those depicted in FIG. 4B. Note that whereas in FIG. 1A, the variable impedance circuit is connected between $V_{SUPPLY}$ and the calibration node, in FIG. 1B, the variable impedance circuit is connected between ground and the calibration node. Operation of the circuit 100 of FIG. 1B is similar to the circuit of FIG. 1A, with some differences. In FIG. 1B, $V_{CAL}$ is equal to $I_{TIREF}*R_{VIC}$, where $R_{VIC}$ is the impedance of the variable impedance circuit 104 at the present DAC. At the completion of trimming, the impedance of the NMOS drivers (e.g., drivers 422 in FIG. 4B) in the variable impedance circuit 104 are equal to or slightly less than $R_T$, in one embodiment.

Figure 2A:
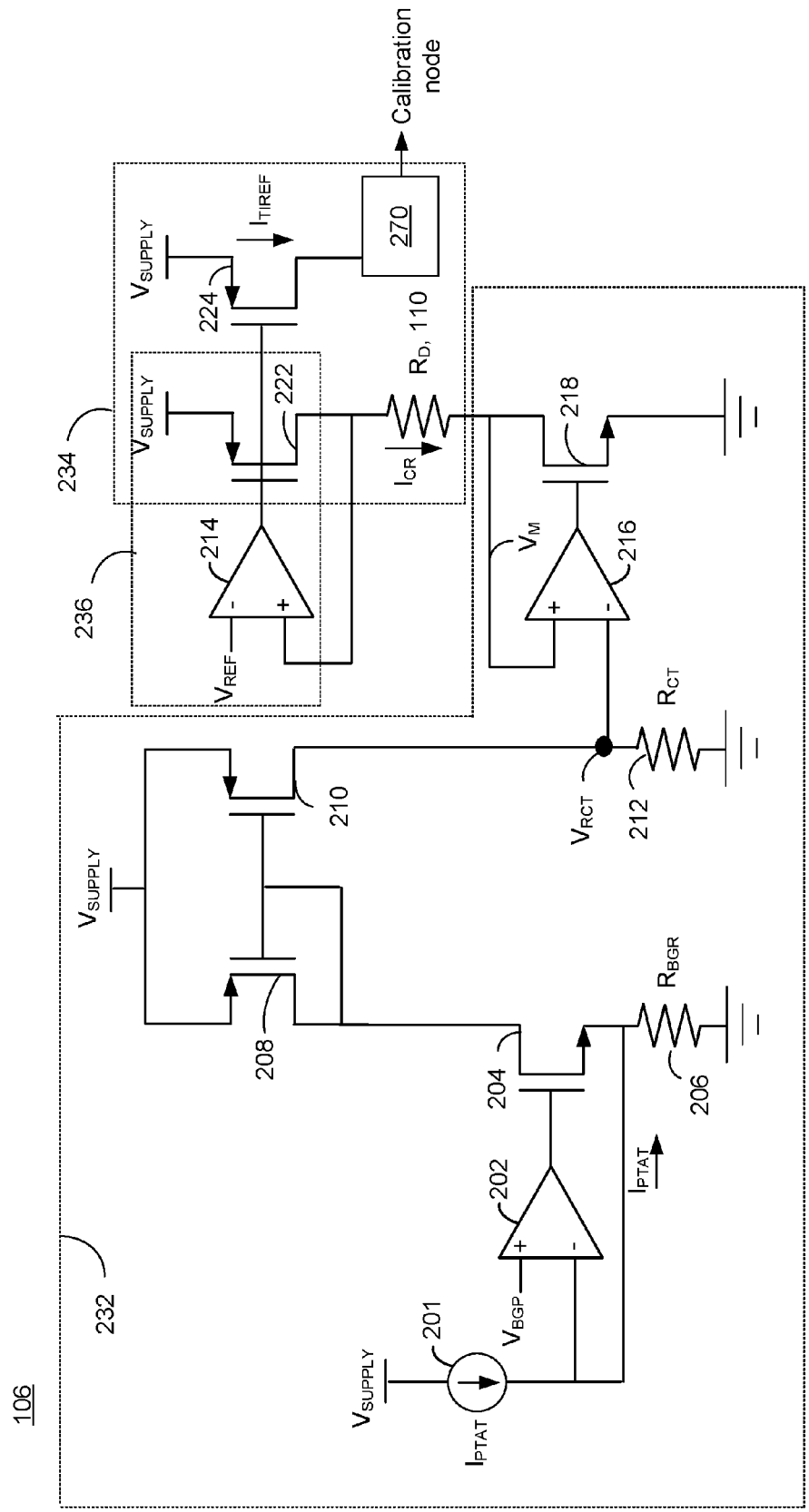
FIG. 2A is a diagram of one embodiment of a temperature independent reference current generation circuit in which the on chip calibration resistor may have a positive TCO.
Figure 2B:
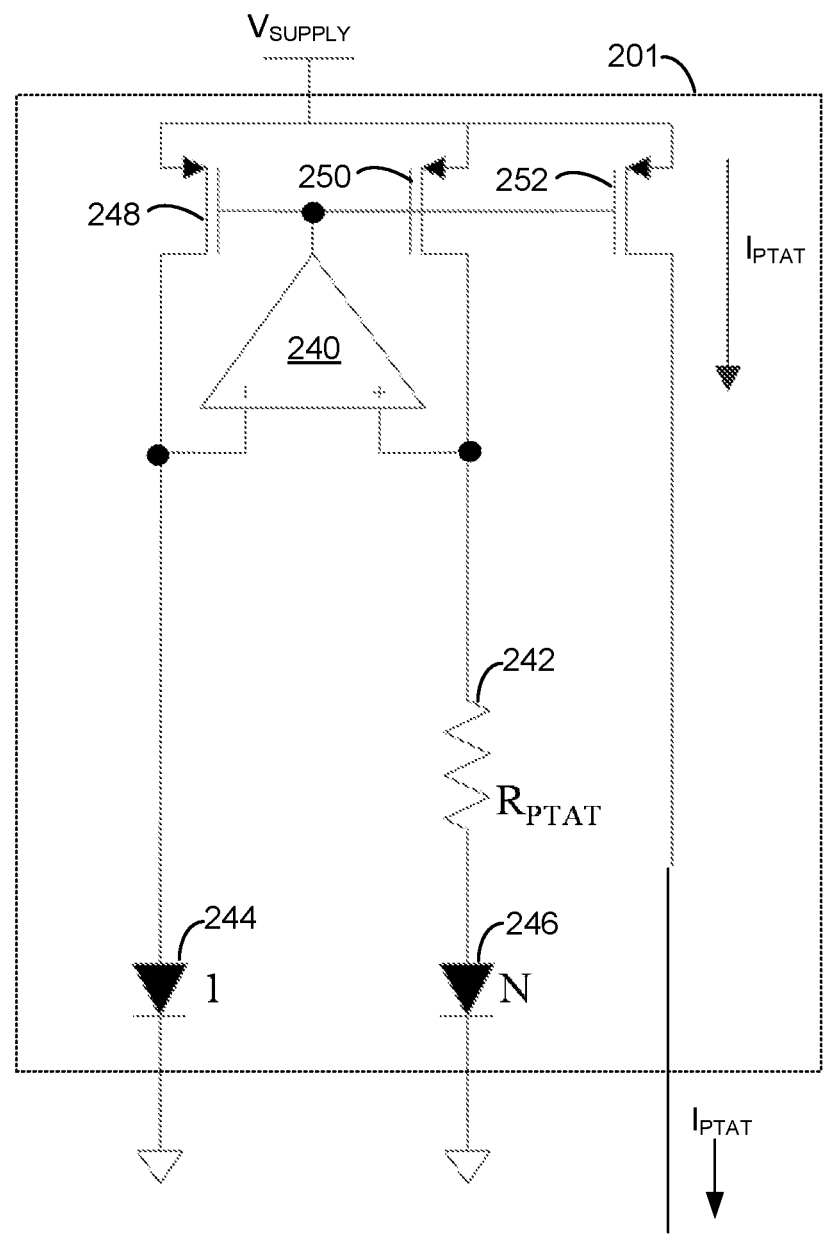
FIG. 2B is a diagram of one embodiment of an $I_{PTAT}$ current generation circuit of FIG. 2A.
Figure 2D:
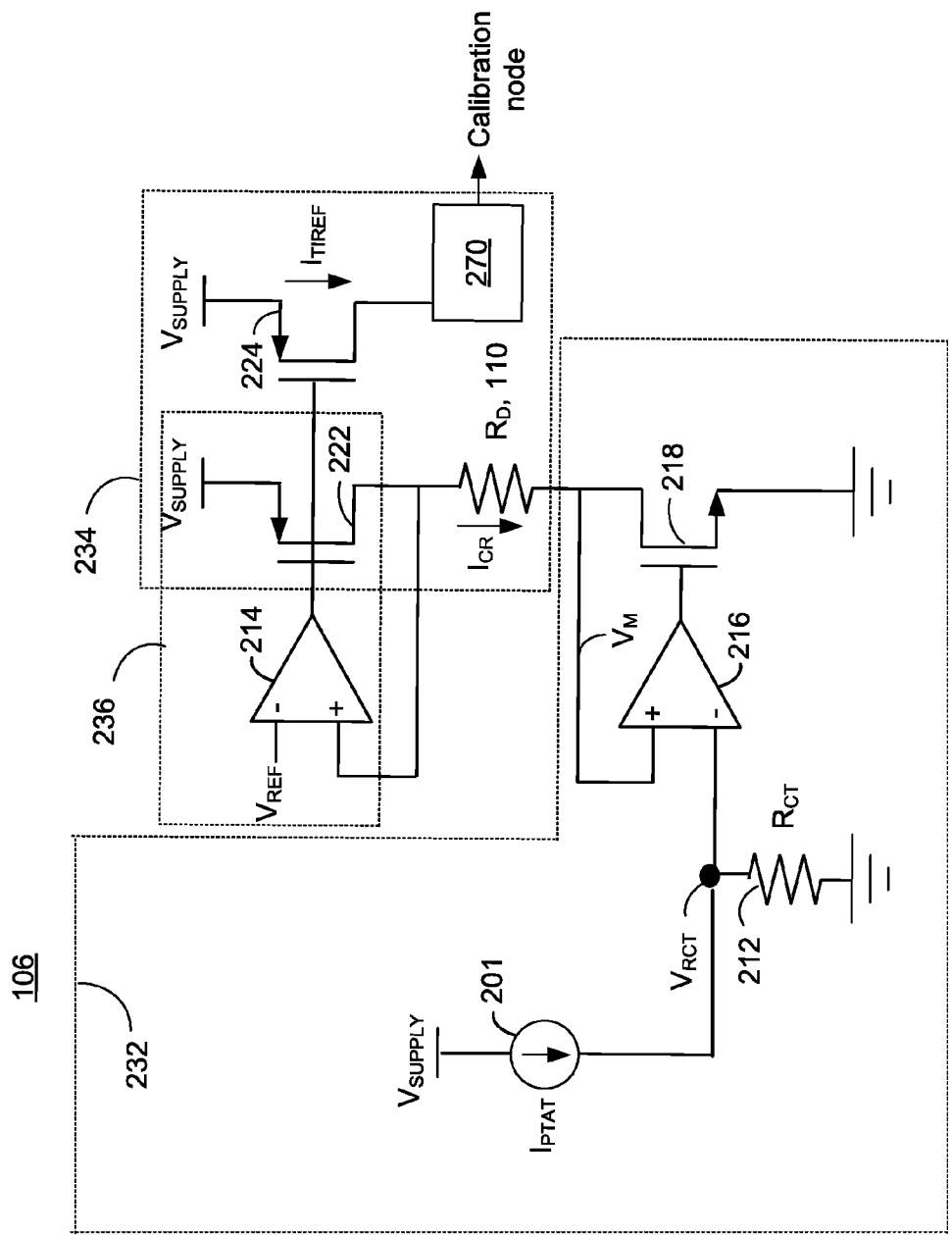
FIG. 2D is a diagram of one embodiment of a temperature independent reference current generation circuit in which the on chip calibration resistor has a negative TCO.

FIG. 2A is a diagram that provides further details of one embodiment of temperature independent reference current generation 106 of FIG. 1A or 1B. The circuit 106 includes an on-chip calibration resistor 110. The resistance of the on-chip calibration resistor 110 changes with temperature. In other words, the resistance of the on-chip calibration resistor 110 has a TCO. For example, the resistance of the on-chip calibration resistor 110 may increase with increases in temperature (e.g., the TCO of the resistance is positive). Were the voltage across the on-chip calibration resistor 110 having a positive TCO to remain constant, this implies that the current ($I_{CR}$) through the chip calibration resistor 110 would decrease as temperature increases. The circuit of FIG. 2A may be used with a resistor 110 having a positive TCO. Alternatively, the resistance of the on-chip calibration resistor 110 might decrease with increases in temperature (e.g., the TCO of the resistance is negative). With a suitable modification to the circuit of FIG. 2A, the concept may be used with a resistor having a negative TCO. FIG. 2D shows one embodiment of circuit that may be used with a resistor having a negative TCO. For an on-chip calibration resistor 110 having a negative TCO, were the voltage across the on-chip calibration resistor 110 to remain constant, this implies that $I_{CR}$ would increase as temperature increases.

Whether the TCO of the on-chip calibration resistor 110 is negative or positive may depend on the material from which the resistor 110 is fabricated, doping, and other factors. For example, the resistivity of undoped silicon may have a negative TCO. However, depending on the type of impurity used to dope, as well as the doping concentration, doped silicon could have a positive TCO or a negative TCO. Also, the magnitude of the TCO of resistivity for a semiconductor may depend on type of impurity used to dope, as well as the doping concentration. In one embodiment, the on-chip calibration resistor 110 is fabricated from silicon that is doped with a type and concentration of an impurity that causes the resistivity of the doped silicon to have a positive TCO.

One terminal of the on-chip calibration resistor 110 is supplied with $V_{REF}$ from operational amplifier 214. Note that one terminal of calibration resistor 110 is coupled to the non-inverting input of operational amplifier 214. Also, the inverting input of operational amplifier 214 is supplied with $V_{REF}$. Since the non-inverting input of operational amplifier 214 is forced to $V_{REF}$, one terminal of the on-chip calibration resistor 110 is supplied with $V_{REF}$.

The other terminal of the on-chip calibration resistor 110 is provided with a modulating voltage ($V_M$). The magnitude of the modulating voltage may be a function of temperature. Herein, this is referred to as the modulating voltage having a TCO. This results in the voltage across the on-chip calibration resistor 110 being a function of temperature. In one embodiment, the TCO of the modulating voltage cancels the TCO of the resistance of the on-chip calibration resistor 110. This may result in the current ($I_{CR}$) through the on-chip calibration resistor 110 being independent of temperature. Thus, $I_{CR}$ may be maintained at a constant magnitude despite temperature variations.

In the circuit of FIG. 2A, the magnitude of the modulating voltage ($V_M$) may be lower than the magnitude of $V_{REF}$. Therefore, decreasing $V_M$ will result is a greater voltage across the on-chip calibration resistor 110, and hence a greater current ($I_{CR}$) through the on-chip calibration resistor 110. In one embodiment, $V_M$ has a negative TCO to cancel a positive TCO of the on-chip calibration resistor 110. As temperature increases, the resistance of the calibration resistor may increase, but $V_M$ may decrease such that the current through the calibration resistor is constant despite temperature changes.

The current ($I_{CR}$) through the on-chip calibration resistor 110 also flows through PMOS transistor 222, whose current is mirrored to PMOS transistor 224. The current through PMOS transistor 224 may be used as the temperature independent reference current ($I_{TIREF}$). Note that there may be some scaling of $I_{CR}$. For example, the ratio of transistor PMOS 224 to PMOS transistor 222 may be selected to scale current $I_{CR}$ up or down. The current through PMOS transistor 224, or some version of it, may be used for the temperature independent reference current ($I_{TIREF}$) in FIG. 1A or 1B. For example, the current through transistor 224 may be scaled up or down prior to providing it to the calibration node in FIG. 1A or 1B. However, since $I_{TIREF}$ is based on $I_{CR}$, $I_{TIREF}$ is independent of temperature, in one embodiment. Thus, $I_{TIREF}$ may be maintained at a constant magnitude despite temperature variations. In FIG. 2A, transfer circuit 270 is depicted to provide $I_{TIREF}$ to the calibration node. Transfer circuit 270 may be implemented with transistors. For example, transfer circuit 270 may be a current mirror. Example transfer circuits 270 are depicted in FIGS. 2C1 and 2C2.

Also note that the output of operational amplifier 214 is connected to the gate terminal of PMOS transistor 222, as well as to the gate terminal of PMOS transistor 224. Also the source terminals of PMOS transistors 222 and 224 are each connected to the voltage supply. Thus, the drain terminal of PMOS transistor 222 is connected to the non-inverting input of operational amplifier 214.

Next, details of generating the modulating voltage ($V_M$) will be discussed. The magnitude of the modulating voltage ($V_M$) is based, at least in part, on a proportional to absolute temperature current ($I_{PTAT}$). FIG. 2A depicts an $I_{PTAT}$ current source 201. The $I_{PTAT}$ current source 201 may be implemented by a band gap reference (BGR) circuit. Thus, $I_{PTAT}$ may be generated by the band gap reference (BGR) circuit. One embodiment of $I_{PTAT}$ current source 201 is depicted in FIG. 2B.

$I_{PTAT}$ current source 201 is connected between the supply voltage and the inverting input of operational amplifier 202. The non-inverting input of operational amplifier 202 is supplied with $V_{BGP}$. Due to the circuit configuration, the voltage at the non-inverting input should be forced to $V_{BGP}$.

The output of operational amplifier 202 is connected to the gate terminal of NMOS transistor 204. The source terminal of NMOS transistor 204 is connected to the inverting input of operational amplifier 202. The drain terminal of NMOS transistor 204 is connected to PMOS transistor 208, which forms a current mirror with PMOS transistor 210.

Band gap reference resistor $R_{BGR}$ 206 is connected between the inverting input of operational amplifier 202 and ground. The current in $R_{BGR}$ 206 is $I_{PTAT}$ plus the current of transistor 204 (referred to as $I_{CTAT}$). Also, during circuit operation, the inverting input of operational amplifier 202 will be forced to $V_{BGP}$. The resistance of resistor $R_{BGR}$ 206 will be referred to as "$R_{BGR}$". Hence, resistor $R_{BGR}$ 206 in effect has $V_{BGP}$ provided to the terminal that receives $I_{PTAT}$ and $I_{CTAT}$. Hence, $I_{CTAT}$ is given by Equation 3:

$$I_{CTAT}=V_{BGP}/R_{BGR}-I_{PTAT} \quad (3)$$

The current ($I_{CTAT}$) may also be expressed by Equation 4:

$$I_{CTAT}=V_{BGP}/R_{BGR}-V_T*1nN/R_{PTAT} \quad (4)$$

The current $I_{CTAT}$ flows through NMOS transistor 204 and PMOS transistor 208. The current through PMOS transistor 208 is mirrored to PMOS transistor 210. Note that the source terminals of PMOS transistor 208 and PMOS transistor 210 are each connected to the supply voltage, and their gate terminals are connected. In one embodiment, PMOS transistors 208 and 210 are similar in size such that the current through transistor 210 is substantially equal to $I_{CTAT}$. However, PMOS transistors 208 and 210 do not need to be the same size, in which case the current through transistor 210 may be a scaled version of $I_{CTAT}$. The current of PMOS transistor 210 also flows through voltage modulation resistor $R_{CT}$ 212. This current is $I_{CTAT}$ in one embodiment. As noted, this could also be some scaled version of $I_{CTAT}$. Voltage modulation resistor $R_{CT}$ 212 is connected between the inverting input of operational amplifier 216 and ground. Thus, the voltage at the inverting input of operational amplifier 216 may be given by Equation 5:

$$V_{RCT}=I_{CTAT}*R_{CT} \quad (5)$$

The output of operational amplifier 216 is connected to the gate terminal of NMOS transistor 218. The source of NMOS transistor 218 is connected to ground. The drain of NMOS transistor 218 is connected to the non-inverting input of operational amplifier 216. The voltage at the non-inverting input of operational amplifier 216 may be forced to $V_{RCT}$. Thus, the modulating voltage $V_M$ may be equal to $V_{RCT}$. It may be stated that the node of the voltage modulation resistor 212 that is not grounded is coupled to the second terminal of the calibration resistor 110, as the voltage $V_{RCT}$ may be provided to the second terminal of the calibration resistor 110.

Several sub-circuits are highlighted within temperature independent reference current generation 106. A voltage modulating circuit 232 is configured to provide a modulating voltage ($V_M$) to one of the terminals of the calibration resistor 110. For example, the voltage modulating circuit 232 modulates a voltage at a terminal of the calibration resistor 110 to cancel the temperature coefficient of the calibration resistor. Therefore, the current passing through the calibration resistor 110 may be temperature independent. The voltage modulating circuit 232 is made up of the $I_{PTAT}$ source 201, resistors 206, 212, operational amplifiers 202, 216, and transistors 204, 208, 210, and 218. Other circuit elements could be used for voltage modulating circuit 232. The voltage modulating circuit 232 may also be referred to as a temperature dependent voltage generation circuit. The temperature dependent voltage generation circuit may be configured to generate a voltage ($V_M$) at the second terminal the calibration resistor 110 that has a temperature coefficient configured to cancel the temperature coefficient of the calibration resistor 110.

A reference voltage circuit 236 may be configured to provide a reference voltage ($V_{REF}$) to another terminal of the calibration resistor 110. The reference voltage circuit 236 is made up of operational amplifier 214 and transistor 222. A temperature independent reference current circuit 234 may be configured to derive the temperature independent reference current ($I_{TIREF}$) from the temperature independent current ($I_{CR}$) passing through the calibration resistor 110. The temperature independent reference current circuit 234 may be made up of the calibration resistor 110, transistor 222, transistor 224, and transfer circuit 270. Other circuit elements could be used for temperature independent reference current circuit 234.

Several circuit elements in FIG. 2A may together be referred to as a proportional to temperature circuit that is configured to provide a current proportional to temperature through the voltage modulation resistor 212. Specifically, a portion of the voltage modulating circuit 232 that provides the current to voltage modulation resistor 212 may serve this purpose. Those elements include $I_{PTAT}$ source 201, operational amplifier 202, resistor $R_{BGR}$ 206, and transistors 204, 208, and 210. Other circuit elements could be used for proportional to temperature circuit.

The foregoing are examples of a voltage modulating circuit 232 (also referred to as a temperature dependent voltage generation circuit), a reference voltage circuit 236, and a temperature independent reference current circuit 234. However, other circuit elements and configurations may be used.

FIG. 2B depicts one embodiment of $I_{PTAT}$ source 201, which may be used in circuit 106 of FIG. 2A or 2D. $I_{PTAT}$ source 201 includes operational amplifier 240, PMOS transistor 248, PMOS transistor 250, PMOS transistor 252, $R_{PTAT}$ resistor 242, diode 244, and diode 246. The source terminals of PMOS transistors 248, 250, and 252 are each connected to the voltage supply ($V_{SUPPLY}$). The drain of PMOS transistor 248 is connected to the inverting input of operational amplifier 240. The drain of PMOS transistor 250 is connected to the non-inverting input of operational amplifier 240. The gates of PMOS transistors 248, 250, and 252 are each connected to the output of operational amplifier 240.

$R_{PTAT}$ resistor 242 is connected between the non-inverting input of operational amplifier 240 and diode 246. Diode 246 is connected between $R_{PTAT}$ resistor 242 and ground. Diode 244 is connected between the inverting input of operational amplifier 240 and ground. Diode 244 and diode 246 have a ratio of 1:N.

$I_{PTAT}$ current flows through PMOS transistor 252. In one embodiment, the drain of PMOS transistor 252 is connected to one terminal of resistor $R_{BGR}$ 206 (see FIG. 2A). In one embodiment, the drain of PMOS transistor 252 is also connected to the inverting input of operational amplifier 202 (see FIG. 2A). Note that resistor $R_{BGR}$ 206 and operational amplifier 202 are depicted in FIG. 2A.

The $I_{PTAT}$ source 201 may also be used in the circuit of FIG. 2D. In one embodiment, the drain of PMOS transistor 252 is connected to one terminal of resistor $R_{CT}$ 212 (see FIG. 2D).

FIG. 2C1 depicts one embodiment of transfer circuit 270, which may be used when using the circuit of FIG. 1A. Transfer circuit 270 may be used in circuit 106 of FIG. 2A or 2D. Transfer circuit 270 provides $I_{TIREF}$ from transistor 224 to the non-inverting input of comparator 108. Transfer circuit 270 includes NMOS transistor 262 and NMOS transistor 260, each of which have their source connected to ground. NMOS transistor 262 and NMOS transistor 260 are in a current mirror configuration. The drain of NMOS transistor 262 is connected to the drain of PMOS transistor 224 in order to receive $I_{TIREF}$ from PMOS transistor 224. The drain of NMOS transistor 260 is connected to the non-inverting input of comparator 108 in order to provide $I_{TIREF}$ to the calibration node.

NMOS transistor 262 and NMOS transistor 260 could be the same size, or may be sized differently. Thus, the version of $I_{TIREF}$ at the non-inverting input of comparator 108 may be the same magnitude as the version of $I_{TIREF}$ that flows through transistor 224, may be scaled up, or may be scaled down. Note that comparator 108 is also depicted in FIG. 1A, and that transistor 224 is also depicted in FIG. 2A.

FIG. 2C2 depicts one embodiment of a circuit that provides $I_{TIREF}$ to the calibration node when using the circuit of FIG. 1B. This circuit may be used in circuit 106 of FIG. 2A or 2D. In this embodiment, the transfer circuit 270 is not needed.

FIG. 2D is a diagram of one embodiment of a temperature independent reference current generation circuit in which the on chip calibration resistor 110 has a negative TCO. The circuit is similar to the one in FIG. 2A. Note that FIG. 2D depicts a different embodiment of voltage modulating circuit 232 than the one depicted in FIG. 2A. A difference is that the $I_{PTAT}$ current is provided directly to resistor 212. In the circuit of FIG. 2D, the resistance of the on-chip calibration resistor 110 may decrease with increases in temperature (e.g., the TCO of the resistance is negative). Were the voltage across the on-chip calibration resistor 110 to remain constant, this implies that the current ($I_{CR}$) through the on chip calibration resistor 110 would increase as temperature increases. $V_M$ has a TCO to cancel the negative TCO of the on-chip calibration resistor 110, in this embodiment. For example, $V_M$ has a positive TCO to cancel the negative TCO of the on-chip calibration resistor 110, in one embodiment. As temperature increases, the resistance of the calibration resistor may decrease, but $V_M$ may increase such that the current through the calibration resistor is constant despite temperature changes. Note that the $I_{PTAT}$ source 201 of FIG. 2B may also be used in the circuit of FIG. 2D. Likewise, transfer circuit 270 from FIG. 2C may be used in the circuit of FIG. 2D.

Figure 3:
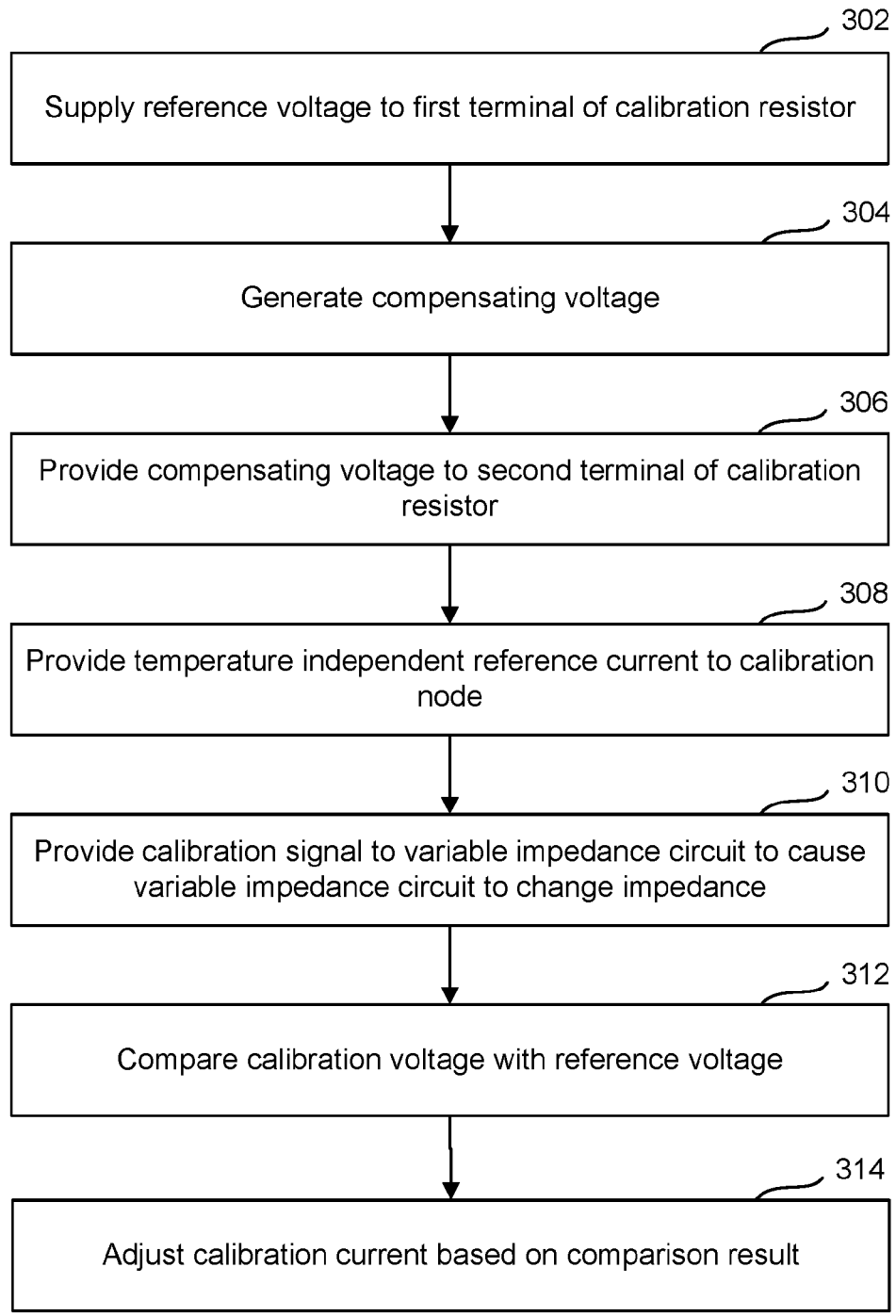
FIG. 3 describes one embodiment of a process of performing an impedance calibration using an on-chip calibration resistor.

FIG. 3 describes one embodiment of a process of performing an impedance calibration using an on-chip calibration resistor. The process may be implemented by the circuits of FIGS. 1A, 1B, 2A, 2B, 2C1, 2C2 and/or 2D, but is not limited thereto. In one embodiment, the process performs a ZQ calibration.

In step 302, a reference voltage is supplied to a first terminal of an on-chip calibration resistor. In one embodiment, the reference voltage circuit 236 provides the reference voltage ($V_{REF}$) to a terminal of on-chip calibration resistor 110.

In step 304, a compensating voltage is generated. The compensating voltage may also be referred to as a modulating voltage. In one embodiment, voltage modulating circuit 232 generates the compensating voltage. In one embodiment, generating the compensating voltage includes generating a proportional to absolute temperature (PTAT) current, and generating the compensating voltage based on the PTAT current. In one embodiment, $I_{PTAT}$ current source 201 generates the $I_{PTAT}$ current. In one embodiment, a current that is based on $I_{PTAT}$ current is provided to voltage modulation resistor 212, creating the compensating voltage at the inverting input of operational amplifier 216.

In step 306, the compensating (or modulating) voltage is provided to a second terminal of the on-chip calibration resistor 110. In one embodiment, voltage modulating circuit 232 provides the compensating voltage to the second terminal of the on-chip calibration resistor 110. More specifically, the non-inverting input of operational amplifier 216 is connected to the lower terminal of on-chip calibration resistor 110 to provide $V_M$. Note that the configuration of operational amplifier 216 and transistor 218 may tend to force the voltage at the non-inverting input to be the same as the voltage at the inverting input of operational amplifier 216. Therefore, the voltage that was created at the terminal of voltage modulation resistor 212 that is not grounded may be provided to the on-chip calibration resistor 110.

In step 308, a temperature independent reference current is provided to a calibration node. The calibration node is the calibration node at the non-inverting input of comparator 108 of FIG. 1A, in one embodiment. The calibration node is the calibration node at the non-inverting input of comparator 108 of FIG. 1B, in one embodiment. In one embodiment, temperature independent reference current generation 106 provides the temperature independent reference current (e.g., $I_{TIREF}$) to the calibration node. In one embodiment, temperature independent reference current circuit 234 generates $I_{TIREF}$ from the current ($I_{CR}$) that passes through the on-chip calibration resistor 110. In one embodiment, the temperature independent reference current is based on the reference voltage and a target calibration resistance. For example, the temperature independent reference current may comply with Equation 1.

In step 310, a calibration signal is provided to a variable impedance circuit to cause the variable impedance circuit to change its impedance. In one embodiment, calibration logic 102 outputs an impedance code (DAC) to the variable impedance circuit 104. The variable impedance circuit 104 changes its impedance based on the value of the impedance code. In one embodiment, the variable impedance circuit 104 outputs $I_{CAL}$ to the calibration node. Moreover, $I_{CAL}$ and $I_{TIREF}$ may be the only significant currents at the calibration node. Therefore, $I_{CAL}$ may have the same magnitude of $I_{TIREF}$. Consequently, $I_{CAL}$ may be equal to $V_{REF}/R_T$.

In step 312, a magnitude of the calibration voltage is compared to a magnitude of the reference voltage. Comparator 108 outputs a flag based on results of the comparison, as discussed above.

In step 314, the calibration signal is adjusted based on results of the comparison. In one embodiment, calibration logic 102 adjusts the impedance code (DAC) based on the value of flag. As discussed already, this causes the variable impedance circuit 104 to adjust its impedance. Step 310-314 can be repeated until the impedance of the variable impedance circuit is balanced with the target resistance to a desired level of accuracy. In one embodiment, a linear search is performed by adjusting the impedance code by one unit at a time. In one embodiment, a binary search is performed. Searches other than linear or binary searches may be performed.

FIG. 4A depicts one embodiment of the variable impedance circuit 104 of FIG. 1A. In one embodiment, the variable impedance circuit 104a is a replica of an output buffer. Hence, variable impedance circuit 104 may be referred to as a replica circuit. In one embodiment, it is a binary weighted pull-up replica.

The variable impedance circuit 104a includes transistors 402-0, 402-1, 402-2, 402-3, 402-4, 402-5, and 402-6. In one embodiment, the transistors 402 are p-channel transistors. One terminal of each transistor 402 is connected to the supply voltage $V_{SUPPLY}$. Another terminal of each transistor is connected to a resistor 414. The resistor 414 is connected to the calibration node. This refers to the calibration node in FIG. 1A.

Each of the transistors 402 has its gate controlled by one of the bits of the impedance code DAC_P<n:0>. Transistor 402-0 has its gate controlled by DAC_P_0, which refers to the least significant bit of DAC_P<n:0>. Transistor 402-1 has its gate controlled by DAC_P_1. Transistor 402-2 has its gate controlled by DAC_P_2. Transistor 402-3 has its gate controlled by DAC_P_3. Transistor 402-4 has its gate controlled by DAC_P_4. Transistor 402-5 has its gate controlled by DAC_P_5. Transistor 402-6 has its gate controlled by DAC_P_6, which is the most significant bit of DAC_P<n:0>. The connections to the gates may be referred to as an input to the variable impedance circuit. The value of the impedance code may be used to select which transistors 402 are on/off in order to control the impedance of circuit 104a.

The transistors may be "binary weighted" such that transistor 402-0 has a weight of "1", transistor 402-1 has a weight of "2", transistor 402-2 has a weight of "4", transistor 402-3 has a weight of "8", transistor 402-4 has a weight of "16", transistor 402-5 has a weight of "32", and transistor 402-6 has a weight of "64". By the weight it is meant the impact the transistor has on the impedance of the main binary weighted pull-up replica 404a.

In one embodiment, the transistors 402 have a binary weighted channel width-to-length ratio (W/L). For example, the binary weighted channel W/L may be 1×, 2×, 4×, 8×, 16×, 32×, and 64×. The transistor W/L may also be referred to as transistor sizes.

In one embodiment, a transistor 402 is implemented by multiple transistors. Thus, it will be understand that each of the transistors 402 may represent one or more transistors. Moreover, there could be a binary relationship between the number of transistors used to implement transistors 402-0 through 402-6. For example, transistor 402-0 might be implemented with a single transistor, transistor 402-1 might be implemented with two transistors, transistor 402-2 might be implemented with four transistors, etc. In this example, each of the implementation transistors might have the same W/L.

Figure 4B:
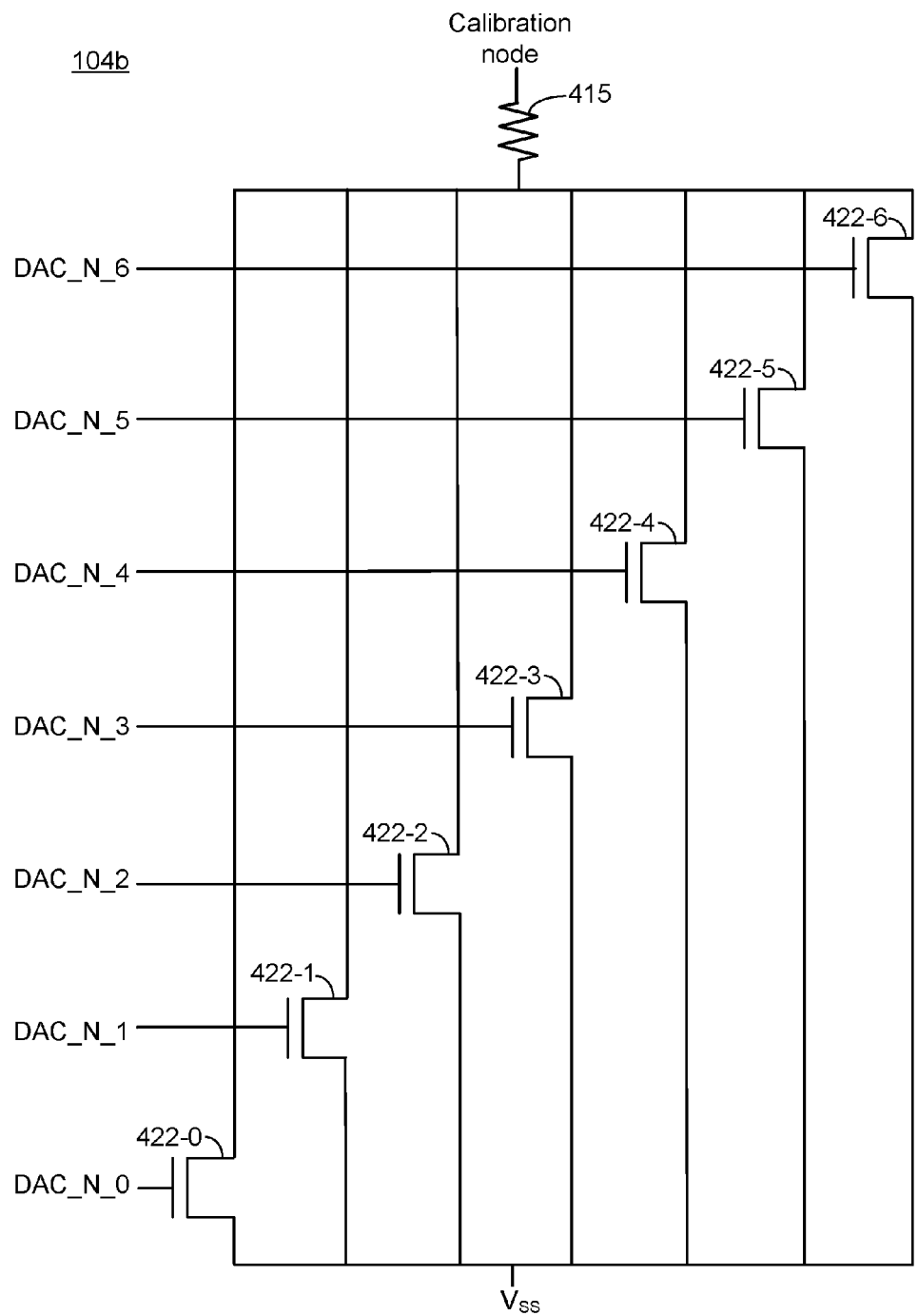
FIG. 4B depicts one embodiment of the variable impedance circuit 104 of FIG. 1B.

FIG. 4B depicts one embodiment of a variable impedance circuit. This could be used in a calibration circuit that is similar to the one depicted in FIG. 1B. In this case, the circuit 104b is a binary weighted pull-down replica. The binary weighted pull-down replica 104b may replicate a portion of an output driver. The binary weighted pull-down replica 104b includes transistors 422-0, 422-1, 422-2, 422-3, 422-4, 422-5, and 422-6. In one embodiment, transistors 422 are n-channel transistors. One terminal of each transistor 422 is connected to the voltage $V_{SS}$, which could be ground. Another terminal of each transistor is connected to a resistor 415. The resistor 415 is connected to the calibration node.

Each of the transistors 422 has its gate controlled by one of the bits of the impedance code DAC_N<n:0>. Transistor 422-0 has its gate controlled by DAC_N_0, which refers to the least significant bit of DAC_P<n:0>. Transistor 422-1 has its gate controlled by DAC_N_1. Transistor 422-2 has its gate controlled by DAC_N_2. Transistor 422-3 has its gate controlled by DAC_N_3. Transistor 422-4 has its gate controlled by DAC_N 4. Transistor 422-5 has its gate controlled by DAC_N_5. Transistor 422-6 has its gate controlled by DAC_N_6, which is the most significant bit of DAC_N<n:0>. The connections to the gates may be referred to as an input to the variable impedance circuit 104b. The value of the impedance code may be used to select which transistors 402 are on/off in order to control the impedance of circuit 104b.

The transistors may be "binary weighted" such that transistor 422-0 has a weight of "1", transistor 422-1 has a weight of "2", transistor 422-2 has a weight of "4", transistor 422-3 has a weight of "8", transistor 422-4 has a weight of "16", transistor 422-5 has a weight of "32", and transistor 422-6 has a weight of "64". By the weight it is meant the impact the transistor has on the impedance of the binary weighted pull-up replica 424a.

In one embodiment, the transistors 422 have a binary weighted channel width-to-length ratio (W/L). For example, the binary weighted channel W/L may be 1×, 2×, 4×, 8×, 16×, 32×, and 64×. The transistor W/L may also be referred to as transistor sizes.

In one embodiment, a transistor 422 of the binary weighted pull-down replica 414a is implemented by multiple transistors. Thus, it will be understand that each of the transistors 422 may represent one or more transistors. Moreover, there could be a binary relationship between the number of transistors used to implement transistors 422-0 through 422-6. For example, transistor 422-0 might be implemented with a single transistor, transistor 422-1 might be implemented with two transistors, transistor 422-2 might be implemented with four transistors, etc. In this example, each of the implementation transistors might have the same W/L.

Note that the examples in FIGS. 4A and 4B are for cases in which the impedance code is seven bits. If the impedance code is greater or less than seven bits, then a corresponding change may be made to the number of transistors in FIGS. 4A and 4B.

The following is further details of generation of the temperature independent reference current. In one embodiment, a target for the temperature independent reference current is given by Equation 6:

$$I_{TIREF} = V_{REF}/R_T \qquad (6)$$

In Equation 6, $R_T$ is the target resistance to which the impedance of the variable impedance circuit 104 is being compared. For example, this could be a target resistance for a ZQ calibration. The reference voltage $V_{REF}$ refers to $V_{REF}$ at the inverting input of comparator 108 in FIG. 1A or 1B. As noted above, this may be one-half of the supply voltage ($V_{SUPPLY}$). Conceptually, $R_T$ could be viewed as a target resistance between the non-inverting input of comparator 108 and ground. Since, $V_{REF}$ may be one-half of $V_{SUPPLY}$, the goal of the circuit of FIG. 1A (or 1B) may be stated as calibrating the impedance of the variable impedance circuit 104 to $R_T$. More specifically, the goal may be stated as adjusting the impedance of the variable impedance circuit 104 until it is equal, or at least close to, $R_T$.

Under the assumption that the magnitude of current through the on-chip calibration resistor 110 is equal to the temperature independent reference current ($I_{TIREF}$), Equation 7 is as follows:

$$(V_{REF} - V_M)/R_D = V_{REF}/R_T \qquad (7)$$

In Equation 7, $V_{REF} - V_M$ refers to the voltage across on-chip calibration resistor 110. As discussed above, the resistance ($R_D$) of the on-chip calibration resistor 110 has a temperature coefficient.

The modulating voltage ($V_M$) is based on a PTAT current, in one embodiment. Equation 8A describes the modulating voltage ($V_M$) in terms of the PTAT current from $I_{PTAT}$ current source 201 and other elements in FIG. 2A. Recall that the circuit of FIG. 2A may be used when the on chip calibration resistor 110 has a positive TCO.

$$V_M = \frac{V_{BGP}}{R_{BGR}} * R_{CT} - \frac{kT}{q} lnN * \frac{R_{CT}}{R_{PTAT}} \qquad (8A)$$

The modulating voltage ($V_M$) has two components in Equation 8A. Each component includes the resistance ($R_{CT}$) of voltage modulation resistor 212 times a current. Recall that the current ($I_{CTAT}$) through the transistor 208 may be reflected to voltage modulation resistor 212. Also recall that the current through transistor 208 may have two components. One of those components may be given by $V_{BGP}/R_{BGR}$. This is due to the impact of $V_{BGP}$ being provided to resistor $R_{BGR}$ 206 by operational amplifier 202. The other current is the $I_{PTAT}$ current. Thus, $I_{CTAT}$ equals the component given by $V_{BGP}/R_{BGR}$ minus the $I_{PTAT}$ current (see Eq. 4), in one embodiment. In Equation 8A, the $I_{PTAT}$ current is expressed in terms of Boltzmann's constant (k), the absolute temperature (T) in Kelvin, the absolute value of charge on an electron (q), and a diode ratio (N) of FIG. 2B (see diodes 244 and 246). $R_{PTAT}$ is the resistance of the $I_{PTAT}$ current source 201 in FIG. 2A, in one embodiment. $R_{PTAT}$ is the resistance of $R_{PTAT}$ resistor 242 in FIG. 2B, in one embodiment.

Equation 8B describes the modulating voltage ($V_M$) in terms of the PTAT current from $I_{PTAT}$ current source 201 and other elements in FIG. 2D. Recall that the circuit of FIG. 2D may be used when the on chip calibration resistor 110 has a negative TCO.

$$V_M = \frac{kT}{q} lnN * \frac{R_{CT}}{R_{PTAT}} \qquad (8B)$$

In one embodiment, the modulating voltage ($V_M$) is designed such that the current ($I_{CR}$) through the on-chip calibration resistor 110 is temperature independent, as indicated by Equation 9.

$$\frac{\partial I_{CR}}{\partial T} = 0 \qquad (9)$$

Given that the derivative of $I_{CR}$ with respect to temperature is zero, the following condition in Equations 10A and 10B may hold true:

$$\frac{\partial V_M}{\partial T} = -\frac{k}{q} lnN * \frac{R_{CT}}{R_{PTAT}} \text{(when } V_M \text{ TCO is negative)} \qquad (10A)$$

$$\frac{\partial V_M}{\partial T} = \frac{k}{q} lnN * \frac{R_{CT}}{R_{PTAT}} \text{(when } V_M \text{ TCO is positive)} \qquad (10B)$$

The following is a restatement of Equation 7, with the temperature dependence of the modulating voltage ($V_M$) and the on-chip calibration resistor ($R_D$) noted:

$$V_{REF}/R_T = \frac{V_{REF} - V_M(T)}{R_D(T)} \qquad (11)$$

A goal of one embodiment is to have modulating voltage ($V_M$) nullify the TCO of the on-chip calibration resistor 110. This goal is reflected by Equation 12, which expresses a condition for the temperature dependence of the modulating voltage in order to nullify the TCO of the on-chip calibration resistor. In Equation 12, $TCO_{RD}$ may be the temperature coefficient with respect to resistivity of the material(s) (after doping, if doping is used) from which the on-chip calibration resistor 110 is formed. Stated differently, $TCO_{RD}$ may be the temperature coefficient with respect to resistance of the on-chip calibration resistor 110. In one embodiment, $TCO_{RD}$ is a positive value. However, $TCO_{RD}$ could be a negative value, depending on factors such as the material from which the on-chip calibration resistor is fabricated, doping levels, dopant materials, etc. Note that Equation 12 may hold whether the TCO of the on-chip calibration resistor is positive or negative.

$$\frac{\partial V_M}{\partial T} = V_{REF} * \left[ -\frac{R_D(T)}{R_T} \right] * TCO_{RD} \qquad (12)$$

Equation 13 gives a design equation for one embodiment, where the derivative of the modulating voltage ($V_M$) with respect to temperature may be given by Equation 12.

$$R_{CT} = -\frac{\partial V_M}{\partial T} * \frac{q}{k} * \frac{1}{\ln N} * R_{PTAT} \qquad (13)$$

The value of $R_{PTAT}$ may be a property of the $I_{PTAT}$ current source 201, in one embodiment. In one embodiment, $R_{PTAT}$ is $R_{PTAT}$ resistor 242 in FIG. 2B. With the value for $R_{PTAT}$ known, a suitable value for $R_{CT}$ may be determined from Equations 12 and 13. In the event the circuit of FIG. 2A is used, once a suitable value for value for $R_{CT}$ is found, a suitable value for value for $R_{BGR}$ may be determined from, for example, Equation 8A to have an appropriate level for $V_M$.

Note that the on-chip calibration resistor 110 may be trimmed to compensate for process variation. For example, if the on-chip calibration resistor 110 is formed from doped polysilicon, its resistance could depend on factors such as the number and size of grain boundaries, shape (length, width, height) of the polysilicon, doping concentration, etc. In one embodiment, the on-chip calibration resistor 110 is trimmed such that at a reference temperature its resistance equals a target resistance.

Figure 5:
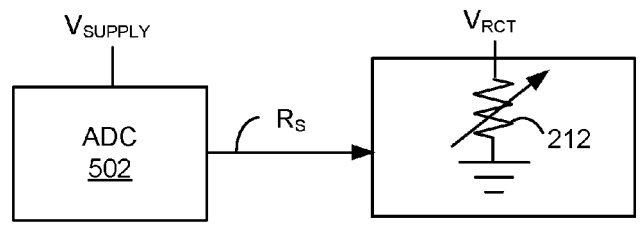
FIG. 5 shows one embodiment of a circuit for varying the resistance of a voltage modulation resistor as a function of the supply voltage.

In one embodiment, the resistance of the voltage modulation resistor $R_{CT}$ 212 is variable to account for variations in the supply voltage $V_{SUPPLY}$. FIG. 5 shows one embodiment of a circuit for varying the resistance of the voltage modulation resistor $R_{CT}$ 212 as a function of the supply voltage. The supply voltage is provided to the analog-to-digital converter (ADC) 502. The ADC 502 generates a digital signal $R_S$ that is proportional to the magnitude of the supply voltage $V_{SUPPLY}$. The digital signal $R_S$ is provided to the voltage modulation resistor $R_{CT}$ 212. The voltage modulation resistor $R_{CT}$ 212 is configured to modify its resistance based on the digital signal $R_S$.

In some embodiments, the impedance calibration circuit 100 is part of a memory device. The following discussion provides details of the structure of example memory devices which can implement the proposed technology for determining impedance codes.

Figure 6A:
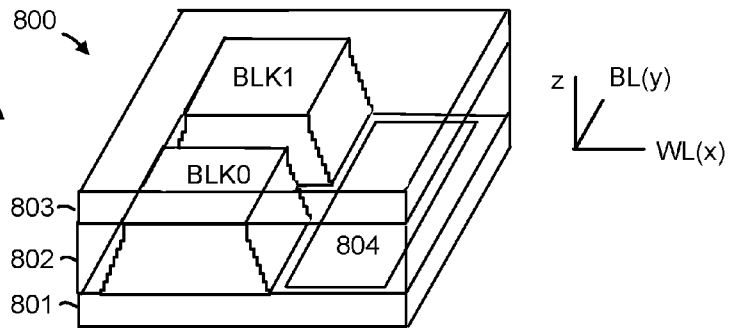
FIG. 6A is a perspective view of a 3D stacked non-volatile memory device in which embodiments may be practiced.

FIG. 6A is a perspective view of a 3D stacked non-volatile memory device. The memory device 800 includes a substrate 801. On and above the substrate are example blocks BLK0 and BLK1 of memory cells (non-volatile storage elements). Also on the substrate is a peripheral area 804 with circuitry for use by the blocks. The substrate 801 can also carry circuitry under the blocks, along with one or more lower metal layers which are patterned in conductive paths to carry signals of the circuitry. The blocks are formed in an intermediate region 802 of the memory device. In an upper region 803 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions. Additionally, note that components are considered to be connected if they are directly connected or indirectly connected.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
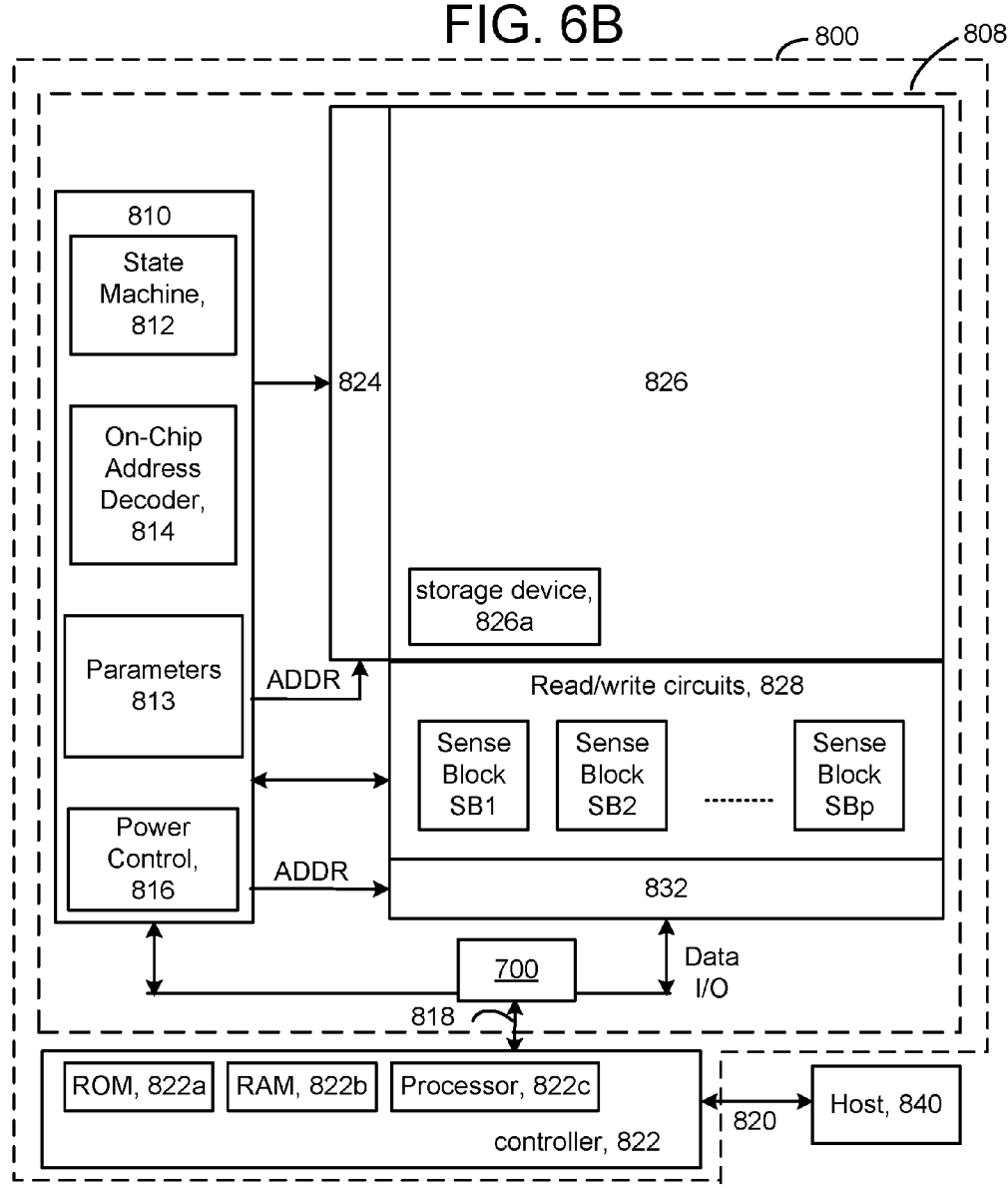
FIG. 6B is a functional block diagram of a memory device such as the 3D stacked non-volatile memory device of FIG. 6A.

FIG. 6B is a functional block diagram of a memory device 800 such as the 3D stacked non-volatile memory device 800 of FIG. 6A. The memory device 800 may include one or more memory die 808. The memory die 808 includes a memory structure 826 of memory cells, such as an array of memory cells, control circuitry 810, and read/write circuits 828. In a 3D configuration, the memory structure can include the blocks BLK0 and BLK1 of FIG. 8A. The memory structure 826 is addressable by word lines via a row decoder 824 and by bit lines via a column decoder 832. The read/write circuits 828 include multiple sense blocks SB1, SB2, . . . , SBp (sensing circuitry) and allow a page of memory cells to be read or programmed in parallel. Typically a controller 822 is included in the same memory device 800 (e.g., a removable storage card) as the one or more memory die 808. In some embodiments, one controller will communicate with multiple memory die. Commands and data are transferred between the host 840 and controller 822 via a data bus 820 and between the controller and the one or more memory die 808 via lines 818. The memory die has I/O circuity 700, in one embodiment. I/O circuity 700 may contain output buffers. In one embodiment, a ZQ calibration of the output buffers is performed using the circuit of FIG. 1.

Memory structure 826 can be a two dimensional structure or a three dimensional structure of memory cells (e.g., NAND flash memory cells). The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 810 cooperates with the read/write circuits 828 to perform memory operations on the memory structure 826, and includes a state machine 812, an on-chip address decoder 814, and a power control module 816. The state machine 812 provides chip-level control of memory operations. Parameter storage 813 may be provided for storing operational parameters.

The on-chip address decoder 814 provides an address interface between that used by the host or a memory controller to the hardware address used by the decoders 824 and 832. The power control module 816 controls the power and voltages supplied to the word lines and bit lines during memory operations. It can include drivers for word line layers (WLLs) in a 3D configuration, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In various embodiments, one or more of control circuitry 810, state machine 812, decoders 814/824/832, power control module 816, sense blocks SB1, SB2, . . . , SBp, read/write circuits 828, and controller 822 can be thought of as at least one or more control circuits.

The off-chip controller 822 may comprise a processor 822c and storage devices (memory) such as ROM 822a and RAM 822b. The storage devices comprises code such as a set of instructions, and the processor 822c is operable to execute the set of instructions to provide the functionality described herein. Alternatively or additionally, processor 822c can access code from a storage device 826a of the memory structure, such as a reserved area of memory cells in one or more word lines.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND flash memory) typically contain memory elements connected in series. A NAND string is an example of a set of series-connected transistors comprising memory cells and select gate transistors.

A NAND flash memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

FIG. 7 depicts a cross-sectional view of a block of the 3D non-volatile memory device of having straight strings. The block contains a number of non-volatile storage elements. This is one example that can be used in the memory array in FIG. 6B. The stack 777 contains alternating layers of conductive (SGS, WL0-WL5, SGD) and insulating (D0-D8) layers. The conductive could be tungsten, highly doped silicon, etc. The insulating layers could be silicon nitride, etc. Columns of memory cells corresponding to NAND strings NSB0 to NSB5, respectively, are depicted in the multi-layer stack. The stack 777 includes a substrate 801, an insulating film 709 on the substrate, and a portion of a source line SLB0. The NAND strings NSB0 to NSB5 are each in a different sub-block, but are in a common set of NAND strings. NSB0 has a source end 603 and a drain end 701. A slit 702 is also depicted with other slits. Slits may be formed from an insulator, such as silicon oxide. A portion of the bit line BLB0 is also depicted. Dashed lines depict memory cells and select gates. Memory cells in layers WL0-WL5. Select gates are in layers SGS and SGD.

A variable impedance means coupled to a calibration node and for supplying to a variable impedance that is proportional to an input code, in various embodiments, may include variable impedance circuit 104, variable impedance circuit 104*a*, variable impedance circuit 104*b*, a plurality of transistors 402, a plurality of transistors 422, and/or other hardware. Other embodiments may include similar or equivalent means for supplying to a variable impedance that is proportional to an input code.

A voltage modulating means for modulating a voltage at a calibration resistor with a resistance having a positive temperature coefficient to substantially cancel the positive temperature coefficient of a calibration resistor to cause a current passing through the calibration resistor to be temperature independent, in various embodiments, may include voltage modulating circuit 232, reference voltage circuit 236, $I_{PTAT}$ source 201, resistors 206, 212, operational amplifiers 202, 216, and transistors 204, 208, 210, and 218, operational amplifier 214, transistor 222, and/or other hardware. $I_{PTAT}$ source 201 may include operational amplifier 240, PMOS transistor 248, PMOS transistor 250, PMOS transistor 252, $R_{PTAT}$ resistor 242, diode 244, and diode 246. Other embodiments may include similar or equivalent means for modulating a voltage at a calibration resistor with a resistance having a positive temperature coefficient to substantially cancel the positive temperature coefficient of a calibration resistor to cause a current passing through the calibration resistor to be temperature independent.

A temperature independent reference current providing means for providing a temperature independent reference current to a calibration node based on the current passing through the calibration resistor, in various embodiments, may include temperature independent reference current circuit 234, on chip calibration resistor 110, transistors 222 and 224, temperature independent reference current generation 106, transfer circuit (e.g., current mirror) 270, transistor 262, transistor 260 and/or other hardware. Other embodiments may include similar or equivalent means for providing a temperature independent reference current to the calibration node based on the current passing through the calibration resistor.

A comparison means for comparing a calibration voltage with a reference voltage to determine whether the calibration voltage is less than or greater than the reference voltage, in various embodiments, may include comparator 108, an operational amplifier, and/or other hardware. Other embodiments may include similar or equivalent means for comparing a calibration voltage with a reference voltage to determine whether the calibration voltage is less than or greater than the reference voltage.

An input code modification means for modifying the input code to the variable impedance means responsive to whether the calibration voltage is less than or greater than the reference voltage, in various embodiments, may include calibration logic 102, processor 822*c*, state machine 812, code stored in ROM 822*a*, RAM 822B, storage device 826*a*, and/or other hardware. Other embodiments may include similar or equivalent means for modifying the input code to the calibration current supplying means responsive to whether the calibration current is less than or greater than the temperature independent reference current.

One embodiment disclosed herein includes an apparatus comprising a reference current generation circuit configured to generate a temperature independent reference current based on a current through a calibration resistor that resides on an integrated circuit and to provide the temperature independent reference current to a calibration node. The apparatus further comprises a variable impedance circuit coupled to the calibration node, and a comparator having a first input coupled to the calibration node and a second input coupled to a reference voltage.

In one embodiment, the apparatus of the previous paragraph further comprises a reference voltage circuit that is configured to provide a voltage that is substantially equal to the reference voltage to the first terminal of the calibration resistor. The apparatus further comprises a voltage modulating circuit coupled to the second terminal of the calibration resistor, wherein the voltage modulating circuit is configured to modulate a voltage at the second terminal of the calibration resistor to substantially cancel the temperature coefficient of the calibration resistor, wherein current passing through the calibration resistor is temperature independent. The apparatus further comprises a temperature independent reference current circuit configured to derive the temperature independent reference current from the temperature independent current passing through the calibration resistor.

In one embodiment, the reference current generation circuit of the apparatus of either of the previous two paragraphs is configured to generate the temperature independent reference current to have a magnitude that is substantially equal to the reference voltage divided by a target resistance ($R_T$) to which the variable impedance circuit is being calibrated.

In one embodiment, the apparatus of any of the previous three paragraphs further comprises logic configured to modify the impedance of the variable impedance circuit responsive to the signal that is output by the comparator to perform a ZQ calibration.

One embodiment disclosed herein includes a method comprising: supplying a reference voltage to a first terminal of a calibration resistor that has a resistance that has a positive temperature coefficient, wherein the calibration resistor resides on an integrated circuit; generating a compensating voltage having a negative temperature coefficient; providing the compensating voltage to a second terminal of the calibration resistor, wherein the compensating voltage substantially nullifies the positive temperature coefficient of the calibration resistor, wherein a current through the calibration resistor has a magnitude that is independent of temperature; providing, to a calibration node, a temperature independent reference current that reflects the current through the calibration resistor, wherein the temperature independent reference current is based on the reference voltage and a target calibration resistance; providing a calibration signal to a variable impedance circuit to cause the variable impedance circuit to change its impedance; comparing a calibration voltage at the calibration node with the reference voltage; and adjusting the calibration signal based on a result of comparing the calibration voltage with the reference voltage.

One embodiment disclosed herein includes non-volatile storage device comprising a plurality of non-volatile storage elements, a reference current generation circuit, a variable impedance circuit, a comparator, and a calibration circuit. The reference current generation circuit comprises a calibration resistor having a first terminal and a second terminal. The first terminal is coupled to a voltage source that provides a first voltage. A resistance of the calibration resistor has a positive temperature coefficient. The reference current generation circuit is configured to modulate a second voltage at the second terminal of the calibration resistor to cancel the positive temperature coefficient of the calibration resistor to cause a current passing through the calibration resistor to be temperature independent. The reference current generation circuit is configured to provide to a calibration node a temperature independent reference current based on the current passing through the calibration resistor. The variable impedance circuit is coupled to the calibration node. The comparator has a first input that is coupled to the calibration node and a second input that is coupled to a node that provides a reference voltage. The comparator is configured to output a signal that indicates whether a calibration voltage at the calibration node is greater than or less than the reference voltage. The calibration circuit is configured to change the impedance of the variable impedance circuit based on the signal that indicates whether the calibration voltage is greater than or less than the reference voltage.

One embodiment includes a non-volatile storage device, comprising a three-dimensional memory array comprising a plurality of non-volatile storage elements, a calibration resistor, reference current generation circuit, a variable impedance circuit, and a comparator. The calibration resistor has a resistance that has a positive temperature coefficient, wherein the calibration resistor has a first terminal coupled to a first reference voltage and a second terminal. The reference current generation circuit may be configured to generate a compensating voltage having a negative temperature coefficient. The reference current generation circuit may be configured to provide the compensating voltage to the second terminal of the calibration resistor, wherein a current that flows in the calibration resistor due to the first reference voltage and the compensating voltage is independent of temperature. The reference current generation circuit may be configured to provide to a calibration node a temperature independent reference current based on the current that flows in the calibration resistor. The variable impedance circuit is coupled to the calibration node. The comparator has a first input that is coupled to the calibration node and a second input that is coupled to a second reference voltage. The comparator may be configured to output a signal responsive to a comparison of a calibration voltage at the calibration node and the second reference voltage.

One of skill in the art will recognize that this technology is not limited to the two dimensional and three dimensional exemplary structures described but covers all relevant memory structures within the spirit and scope of the technology as described herein and as understood by one of skill in the art. The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. An apparatus comprising:
   a reference current generation circuit configured to generate a temperature independent reference current based on a current through a calibration resistor having a first terminal and a second terminal and to provide the temperature independent reference current to a calibration node, wherein a resistance of the calibration resistor has a temperature coefficient;
   a variable impedance circuit coupled to the calibration node;
   a reference voltage circuit configured to provide a first reference voltage to the first terminal of the calibration resistor;
   a voltage modulating circuit configured to modulate a voltage at the second terminal of the calibration resistor to substantially cancel the temperature coefficient of the calibration resistor; and
   a comparator having a first input coupled to the calibration node and a second input coupled to a second reference voltage.

2. The apparatus of claim 1, wherein current passing through the calibration resistor is temperature independent, wherein the first reference voltage is substantially equal to the second reference voltage, wherein the reference current generation circuit further comprises:
   a temperature independent reference current circuit configured to derive the temperature independent reference current from the temperature independent current passing through the calibration resistor.

3. The apparatus of claim 2, wherein the temperature coefficient of the calibration resistor is a positive temperature coefficient, wherein the resistance of the calibration resistor increases with increases in temperature, wherein the voltage modulating circuit is configured to decrease the voltage at the second terminal of the calibration resistor as temperature increases.

4. The apparatus of claim 1, wherein voltage at the second terminal has a temperature coefficient configured to substantially cancel the temperature coefficient of the calibration resistor.

5. The apparatus of claim 4, wherein the temperature coefficient of the voltage at the second terminal is a negative temperature coefficient, wherein the voltage at the second terminal of the calibration resistor decreases with increases in temperature.

6. The apparatus of claim 4, wherein the voltage modulating circuit comprises:
a voltage modulation resistor having a node coupled to the second terminal of the calibration resistor; and
a proportional to temperature circuit configured to provide a current proportional to temperature through the voltage modulation resistor.

7. The apparatus of claim 6, wherein the proportional to temperature circuit is configured to establish a magnitude of the current that is proportional to temperature to modulate the voltage at the node that is coupled to the second terminal of the calibration resistor to substantially cancel the temperature coefficient of the calibration resistor.

8. The apparatus of claim 1, wherein the reference current generation circuit is configured to generate the temperature independent reference current to have a magnitude that is substantially equal to the second reference voltage divided by a target resistance to which the variable impedance circuit is being calibrated.

9. The apparatus of claim 1, wherein the comparator is configured to output a signal that indicates whether a voltage at the calibration node is greater than or less than the second reference voltage, and further comprising logic configured to modify impedance of the variable impedance circuit responsive to the signal that indicates whether the voltage at the calibration node is greater than or less than the second reference voltage.

10. The apparatus of claim 9, further comprising logic configured to modify impedance of the variable impedance circuit responsive to the signal that is output by the comparator to perform a ZQ calibration.

11. The apparatus of claim 1, wherein the temperature coefficient of the calibration resistor is a negative temperature coefficient, wherein the voltage modulating circuit is configured to substantially cancel the negative temperature coefficient of the calibration resistor.

12. The apparatus of claim 1, further comprising:
a three-dimensional memory array comprising a plurality of non-volatile storage elements.

13. A non-volatile storage device comprising:
a plurality of non-volatile storage elements;
a reference current generation circuit that comprises a calibration resistor having a first terminal and a second terminal, wherein the first terminal is coupled to a voltage source that provides a first reference voltage, wherein resistance of the calibration resistor has a positive temperature coefficient, wherein the reference current generation circuit is configured to modulate a second voltage at the second terminal of the calibration resistor to cancel the positive temperature coefficient of the calibration resistor to cause a current passing through the calibration resistor to be temperature independent, wherein the reference current generation circuit is configured to provide to a calibration node a temperature independent reference current based on the current passing through the calibration resistor;
a variable impedance circuit coupled to the calibration node;
a comparator having a first input that is coupled to the calibration node and a second input that is coupled to a node that provides a second reference voltage, wherein the comparator is configured to output a signal that indicates whether a calibration voltage at the calibration node is greater than or less than the second reference voltage; and
a calibration circuit configured to change an impedance of the variable impedance circuit based on the signal that indicates whether the calibration voltage at the calibration node is greater than or less than the second reference voltage.

14. The non-volatile storage device of claim 13, wherein the first reference voltage is equal in magnitude to the second reference voltage.

15. The non-volatile storage device of claim 13, wherein the variable impedance circuit comprises an input and a plurality of transistors coupled to the calibration node, wherein the variable impedance circuit is configured to select transistors to modify a magnitude of the calibration voltage, wherein the variable impedance circuit is configured to output a calibration current to the calibration node that is equal to the temperature independent reference current.

16. The non-volatile storage device of claim 13, wherein the reference current generation circuit further comprises:
a proportional to absolute temperature (PTAT) circuit configured to generate a PTAT current, wherein the reference current generation circuit is configured to modulate the second voltage at the second terminal of the calibration resistor based on the PTAT current.

17. The non-volatile storage device of claim 16, wherein the reference current generation circuit further comprises:
a voltage modulation resistor having a node coupled to the second terminal of the calibration resistor;
wherein the reference current generation circuit is configured to provide a current to the voltage modulation resistor based on the PTAT current to generate a temperature dependent voltage on the node of the voltage modulation resistor that is coupled to the second terminal of the calibration resistor, wherein the reference current generation circuit is configured to provide the temperature dependent voltage to the second terminal of the calibration resistor to nullify the positive temperature coefficient of the calibration resistor.

18. A method comprising:
supplying a reference voltage to a first terminal of a calibration resistor that has a resistance that has a positive temperature coefficient, wherein the calibration resistor resides on an integrated circuit;
generating a compensating voltage having a negative temperature coefficient;
providing the compensating voltage to a second terminal of the calibration resistor, wherein the compensating voltage substantially nullifies the positive temperature coefficient of the calibration resistor, wherein a current through the calibration resistor has a magnitude that is independent of temperature;
providing, to a calibration node, a temperature independent reference current that reflects the current through the calibration resistor, wherein the temperature independent reference current is based on the reference voltage and a target calibration resistance;

providing a calibration signal to a variable impedance circuit to cause the variable impedance circuit to change its impedance, wherein the variable impedance circuit outputs a calibration current that is equal to the temperature independent reference current to the calibration node;

comparing a calibration voltage at the calibration node with the reference voltage; and adjusting the calibration signal based on a result of comparing the calibration voltage with the reference voltage.

19. The method of claim 18, wherein the adjusting the calibration signal based on the result of comparing the calibration voltage with the reference voltage comprises:

performing a ZQ calibration.

20. The method of claim 18, wherein the generating a compensating voltage having a negative temperature coefficient comprises:

generating a proportional to absolute temperature (PTAT) current; and generating the compensating voltage based on the PTAT current.

21. A non-volatile storage device comprising:

variable impedance means coupled to a calibration node and for providing a variable impedance that is proportional to an input code;

reference voltage means for providing a first reference voltage to a first terminal of a calibration resistor;

voltage modulating means for modulating a voltage at a second terminal of the calibration resistor with a resistance having a positive temperature coefficient to substantially cancel the positive temperature coefficient of the calibration resistor to cause a current passing through the calibration resistor to be temperature independent, wherein the calibration resistor resides on an integrated circuit of the non-volatile storage device;

temperature independent reference current providing means for providing a temperature independent reference current to the calibration node based on the current passing through the calibration resistor, wherein the temperature independent reference current is based on a second reference voltage and a target calibration resistance;

comparison means for comparing a calibration voltage at the calibration node with the second reference voltage to determine whether the calibration voltage is less than or greater than the second reference voltage; and input code modification means for modifying the input code to the variable impedance means responsive to whether the calibration voltage is less than or greater than the second reference voltage.

22. The apparatus of claim 1, wherein the calibration resistor resides on an integrated circuit.

* * * * *